(12) United States Patent
Sills et al.

(10) Patent No.: US 11,437,521 B2
(45) Date of Patent: Sep. 6, 2022

(54) METHODS OF FORMING A SEMICONDUCTOR DEVICE

(71) Applicant: Micron Technology, Inc., Boise, ID (US)

(72) Inventors: Scott E. Sills, Boise, ID (US);
Ramanathan Gandhi, Boise, ID (US);
Durai Vishak Nirmal Ramaswamy, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 71 days.

(21) Appl. No.: 16/596,487

(22) Filed: Oct. 8, 2019

(65) Prior Publication Data

US 2020/0111920 A1 Apr. 9, 2020

Related U.S. Application Data

(60) Provisional application No. 62/743,108, filed on Oct. 9, 2018.

(51) Int. Cl.
*H01L 29/66* (2006.01)
*H01L 29/786* (2006.01)
*H01L 27/24* (2006.01)

(52) U.S. Cl.
CPC .... *H01L 29/78642* (2013.01); *H01L 27/2454* (2013.01); *H01L 29/66969* (2013.01); *H01L 29/7869* (2013.01); *H01L 29/78696* (2013.01)

(58) Field of Classification Search
None
See application file for complete search history.

(56) References Cited

U.S. PATENT DOCUMENTS 8,299,516 B2 10/2012 Weng et al.
8,895,979 B2 11/2014 Chang et al.
(Continued)

FOREIGN PATENT DOCUMENTS

KR 10-2018-0026682 A 3/2018
TW 201442082 A 11/2014
(Continued)

OTHER PUBLICATIONS

Billah et al. TCAD Simulation of Dual-Gate a-IGZO TFTs With Source and Drain Offsets, IEEE Electron Device Letters, vol. 37, No. 11, (Nov. 2016), pp. 1442-1445.
(Continued)

*Primary Examiner* — Telly D Green
(74) *Attorney, Agent, or Firm* — TraskBritt

(57) ABSTRACT

A method of forming a device comprises forming dielectric structures over other dielectric structures overlying conductive contact structures, the dielectric structures separated from one another by trenches and laterally extending orthogonal to the other dielectric structures and the conductive contact structures. Conductive gate structures are formed on exposed side surfaces of the dielectric structures within the trenches. Dielectric oxide structures are formed on exposed side surfaces of the conductive gate structures within the trenches. Exposed portions of the other dielectric structures are removed to form isolation structures. Semiconductive pillars are formed on exposed side surfaces of the dielectric oxide structures and the isolation structures within the trenches. The semiconductive pillars are in electrical contact with the conductive contact structures. Additional conductive contact structures are formed on upper surfaces of the semiconductive pillars. A device, a memory device, and an electronic system are also described.

15 Claims, 19 Drawing Sheets

(56) References Cited

U.S. PATENT DOCUMENTS

| | | | |
|---|---|---|---|
| 9,082,793 | B1 | 7/2015 | Ahmed |
| 9,246,013 | B2 | 1/2016 | Ahmed |
| 9,397,145 | B1 | 7/2016 | Sills et al. |
| 9,520,407 | B2 * | 12/2016 | Fukuzumi ............ H01L 29/7926 |
| 9,773,888 | B2 | 9/2017 | Pulugurtha et al. |
| 10,043,808 | B1 * | 8/2018 | Tezuka .............. H01L 29/40114 |
| 2013/0302948 | A1 | 11/2013 | Setiadi et al. |
| 2014/0264548 | A1 | 9/2014 | Lee et al. |
| 2016/0027804 | A1 | 1/2016 | Li et al. |
| 2016/0079385 | A1 | 3/2016 | Ellinger et al. |
| 2016/0149021 | A1 | 5/2016 | Schmenn et al. |
| 2017/0278859 | A1 * | 9/2017 | Sharangpani ..... H01L 27/11582 |
| 2018/0076218 | A1 | 3/2018 | Choi |
| 2018/0090679 | A1 | 3/2018 | Sills et al. |
| 2018/0151588 | A1 * | 5/2018 | Tsutsumi ............ H01L 29/4234 |
| 2018/0254218 | A1 | 9/2018 | Cheng et al. |

FOREIGN PATENT DOCUMENTS

| | | | | |
|---|---|---|---|---|
| TW | | 201836072 A | 10/2018 | |
| WO | WO-2014119537 | A1 * | 8/2014 | ......... G11C 11/1659 |
| WO | 2018/063308 | A1 | 4/2018 | |
| WO | 2018/182609 | A1 | 10/2018 | |

OTHER PUBLICATIONS

Liu et al., Highly Flexible Electronics from Scalable Vertical Thin Film Transistors, Nano Letters, vol. 14, (2014), pp. 1413-1418.

Petti et al., Flexible Quasi-Vertical In—Ga—Zn—O Thin-Film Transistor With 300-nm Channel Length, vol. 36, No. 5, (May 2015), pp. 475-477.

Yoon et al., Effects of Deposition Temperature on the Device Characteristics of Oxide Thin-Film Transistors Using In—Ga—Zn—O Active Channels Prepared by Atomic-Layer, Applied Materials &Interfaces, vol. 9, (2017), pp. 22676-22684.

Zheng et al., All-Sputtered, Flexible, Bottom-Gate IGZO/Al2O3 Bi-LayerThin Film Transistors on PEN Fabricated by a Fully Room Temperature Process, Journals of Materials Chemistry C, vol. 5, (2017), pp. 7043-7050.

Correia et al., A Second-Order S? ADC Using Sputtered IGZO TFTs, Chapter 2, Thin-Film Transistors, (2016), pp. 5-15.

Khakani et al., Reactive Pulsed Laser Deposition of Iridium Oxide Thin Films, Thin Solid Films, vol. 335, (1998), pp. 6-12.

Kushida-Abdelghafar et al., Post-Annealing Effects on Anitreduction Characteristics of IrO2/Pb(ZrxTi1-x)O3/Pt Ferroelectric Capacitors, Journal of Applied Physics, vol. 85, No. 2, (Jan. 15, 1999), pp. 1069-1074.

Taiwanese Office Action for Application No. 108136504, dated Nov. 12, 2020, 15 pages.

International Search Report from International Application No. PCT/US2019/055111, dated Jan. 22, 2020, 3 pages.

International Written Opinion from International Application No. PCT/US2019/055111, dated Jan. 22, 2020, 6 pages.

Taiwanese Second Office Action for Application No. 108136504, dated Jul. 15, 2021, 9 pages.

* cited by examiner

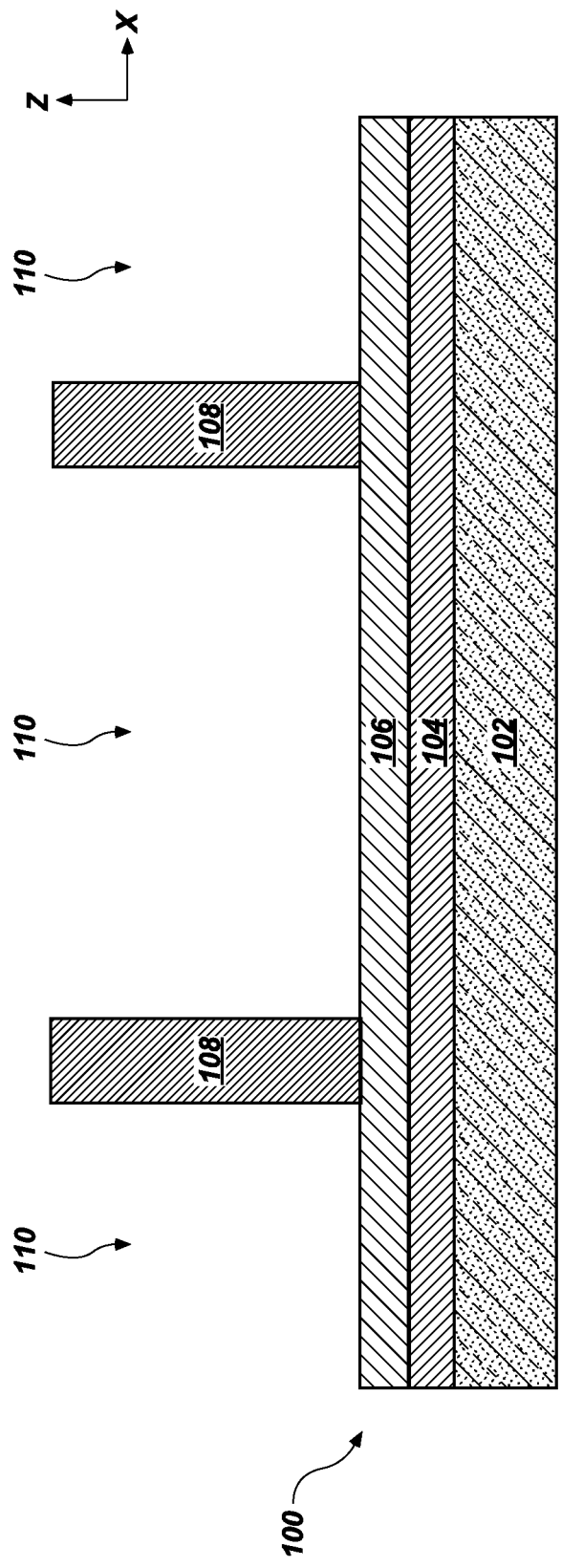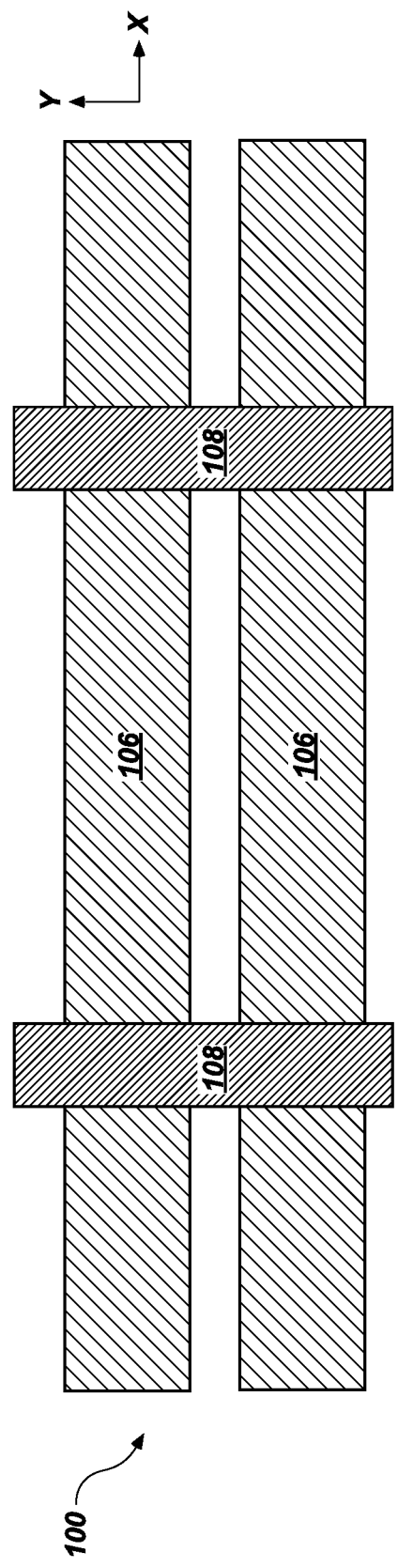
FIG. 1A
FIG. 1B

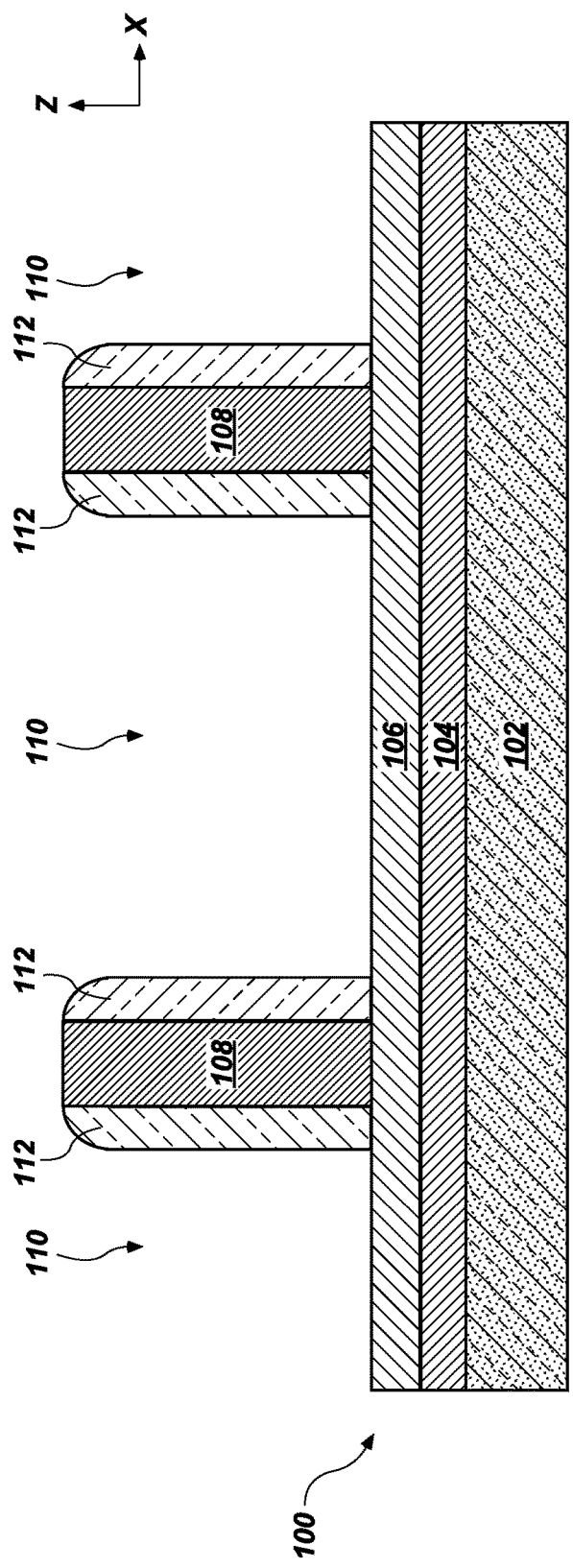
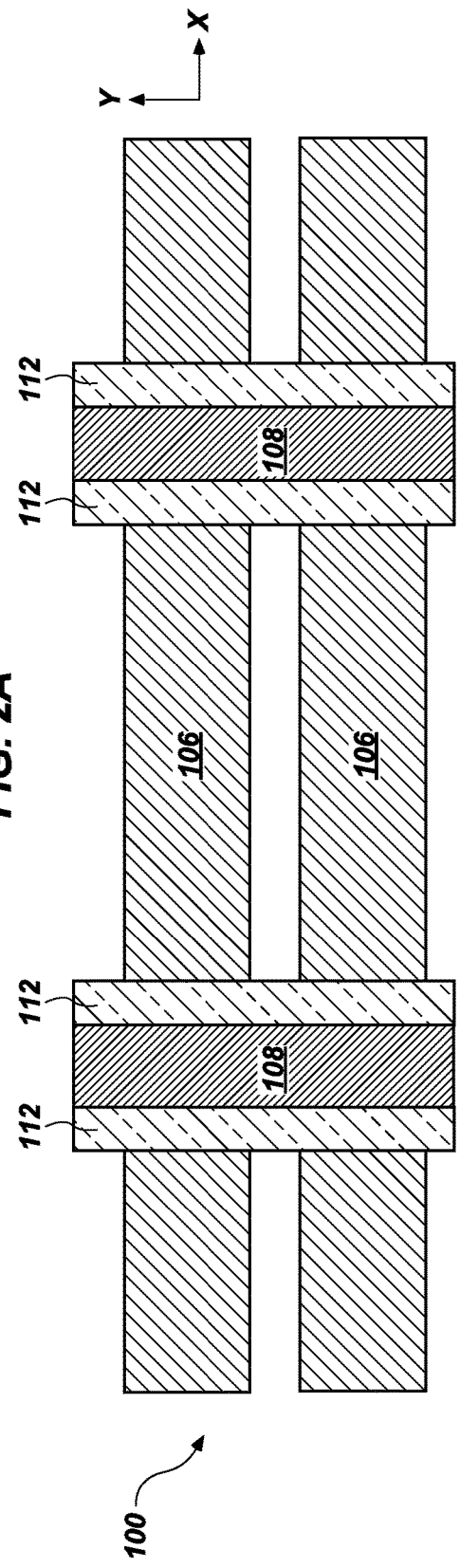
FIG. 2A
FIG. 2B

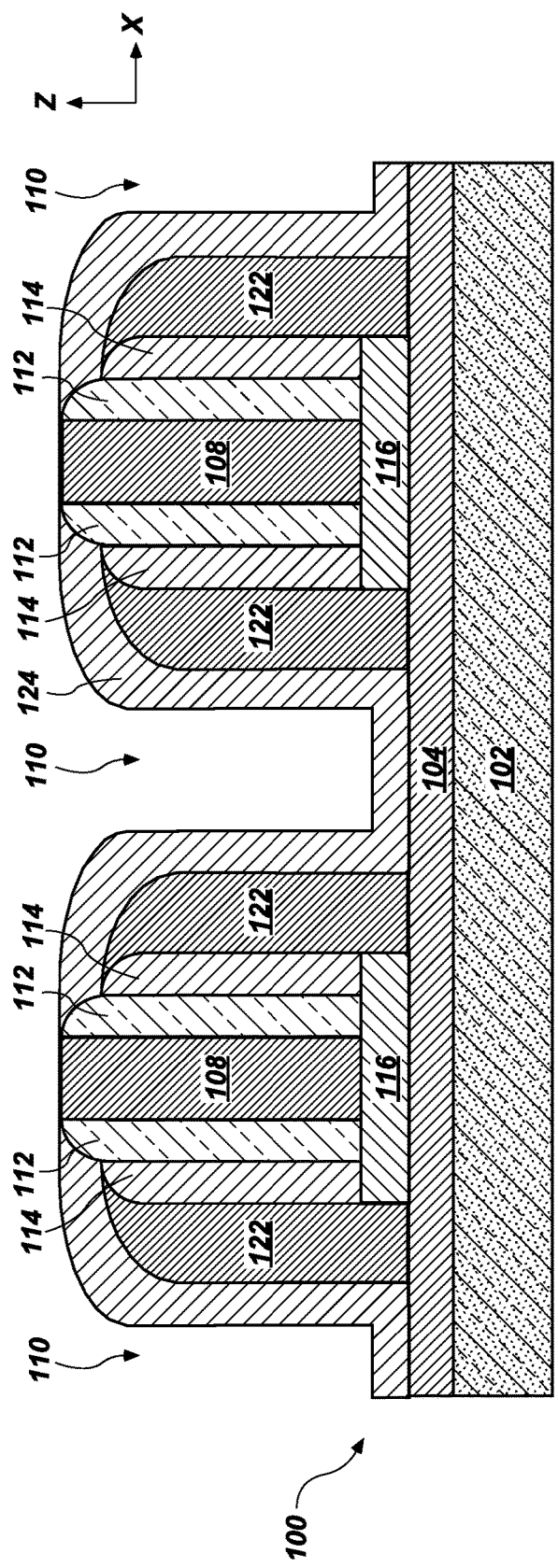
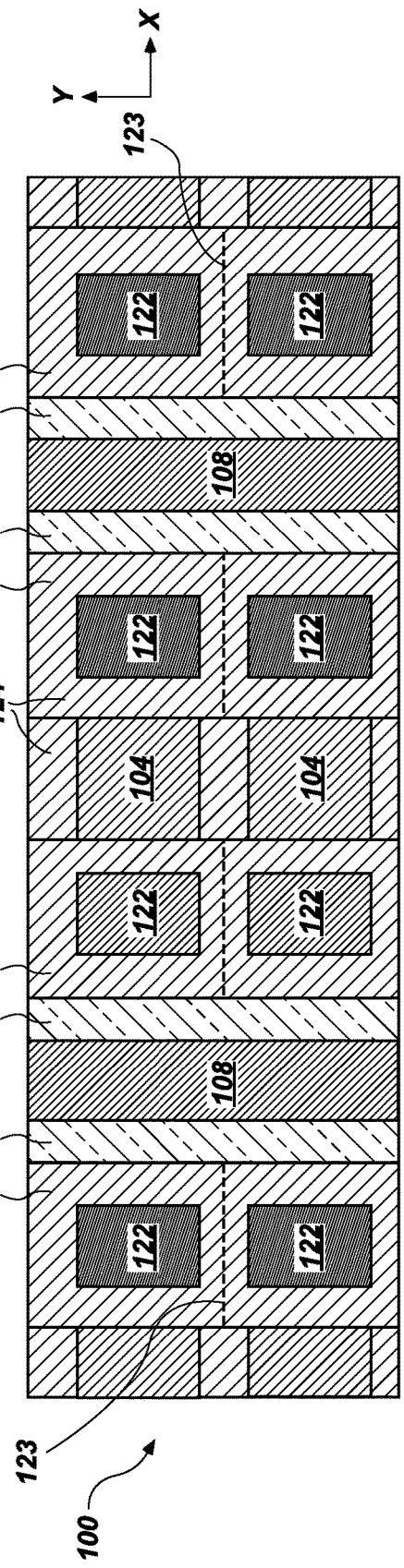
FIG. 8A
FIG. 8B

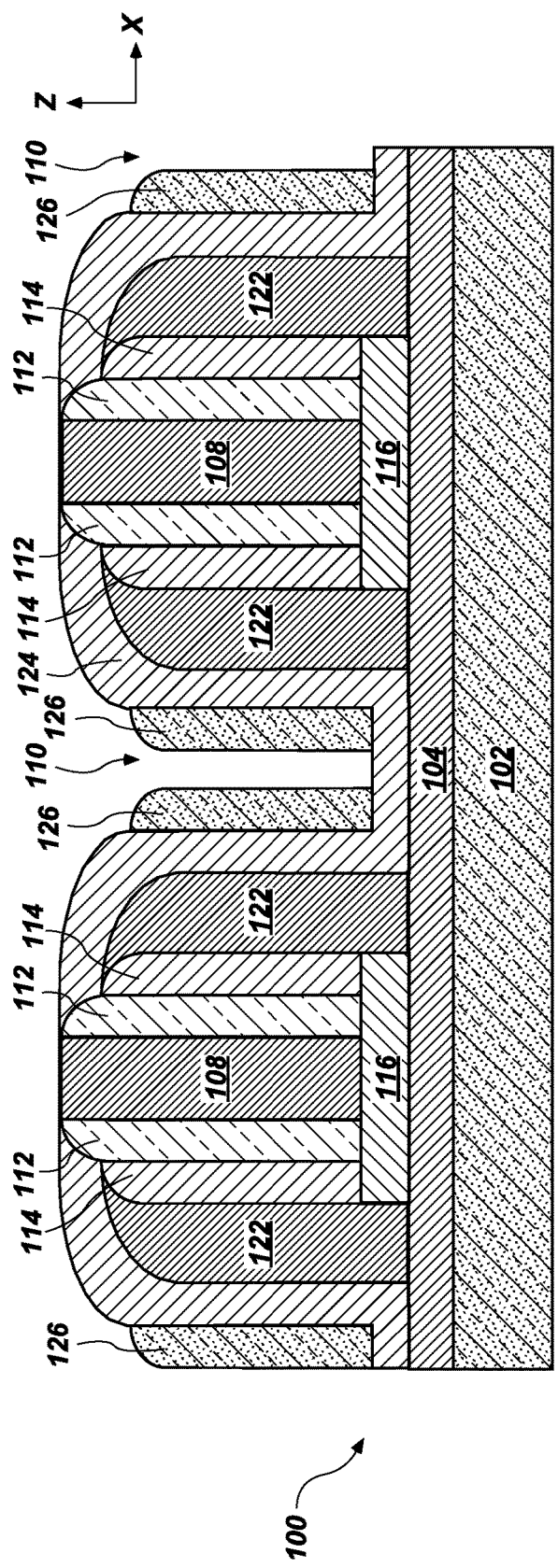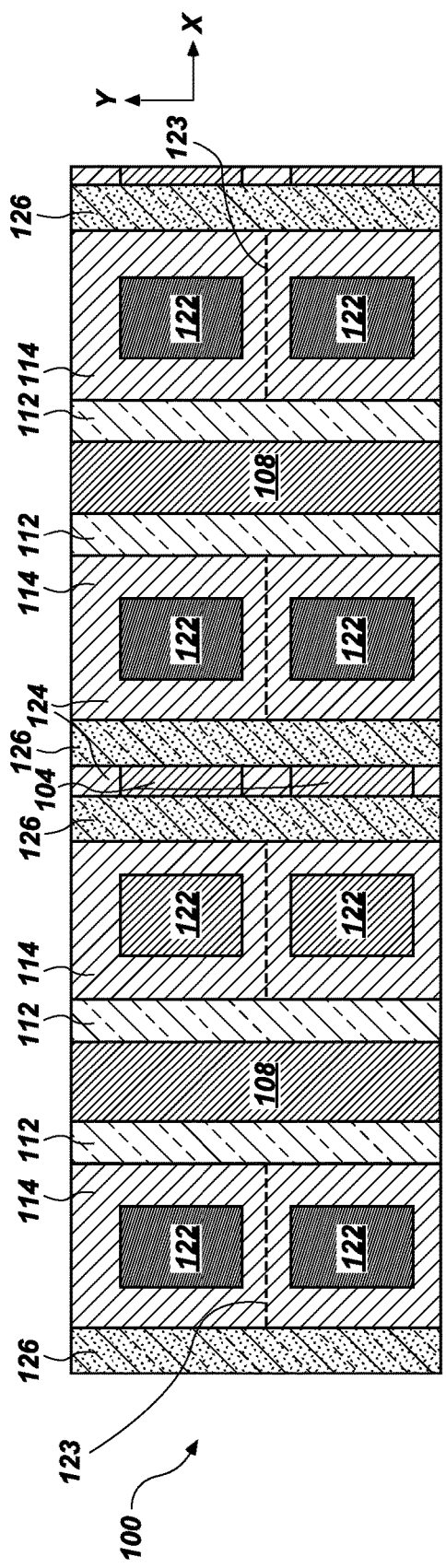
FIG. 9A
FIG. 9B

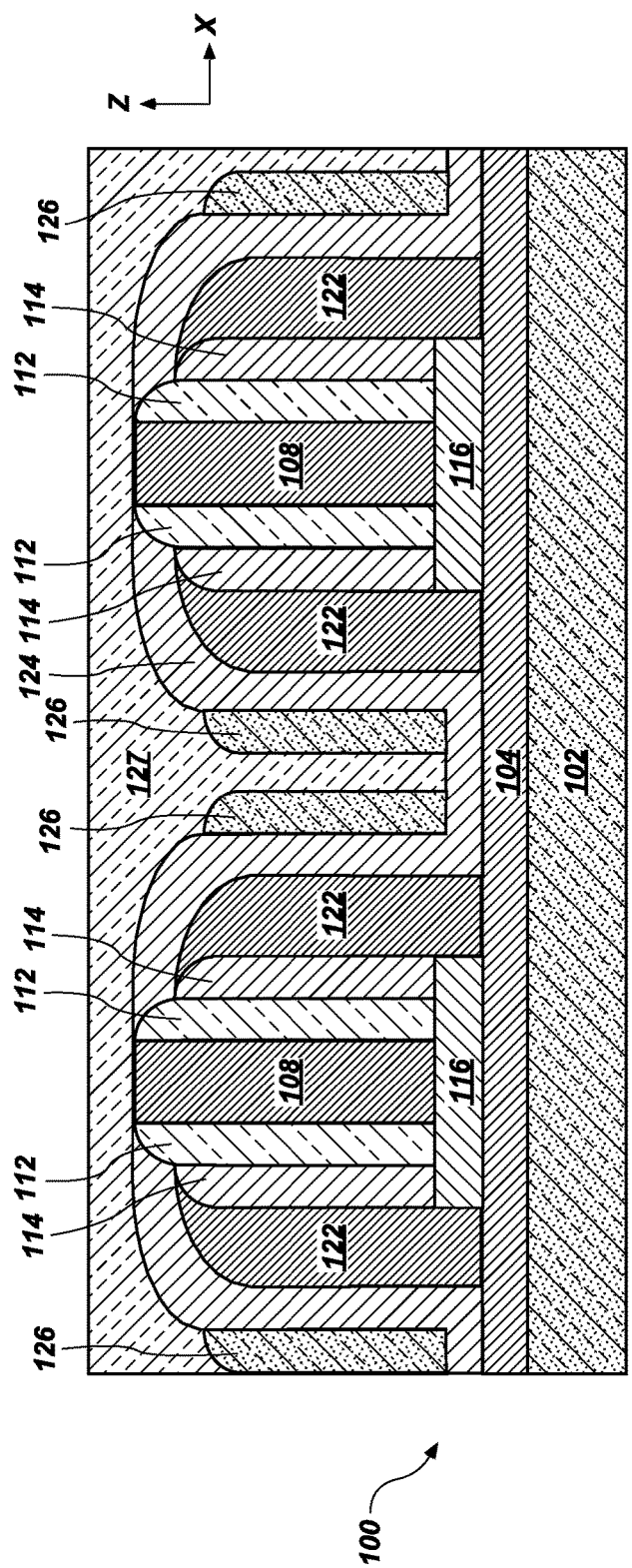
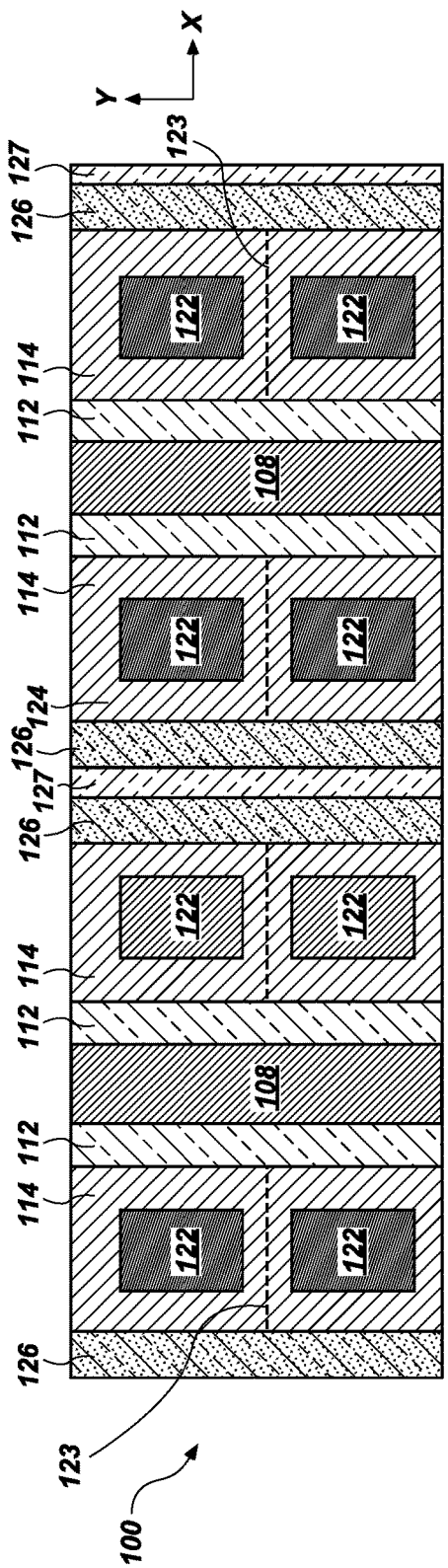
FIG. 10A
FIG. 10B

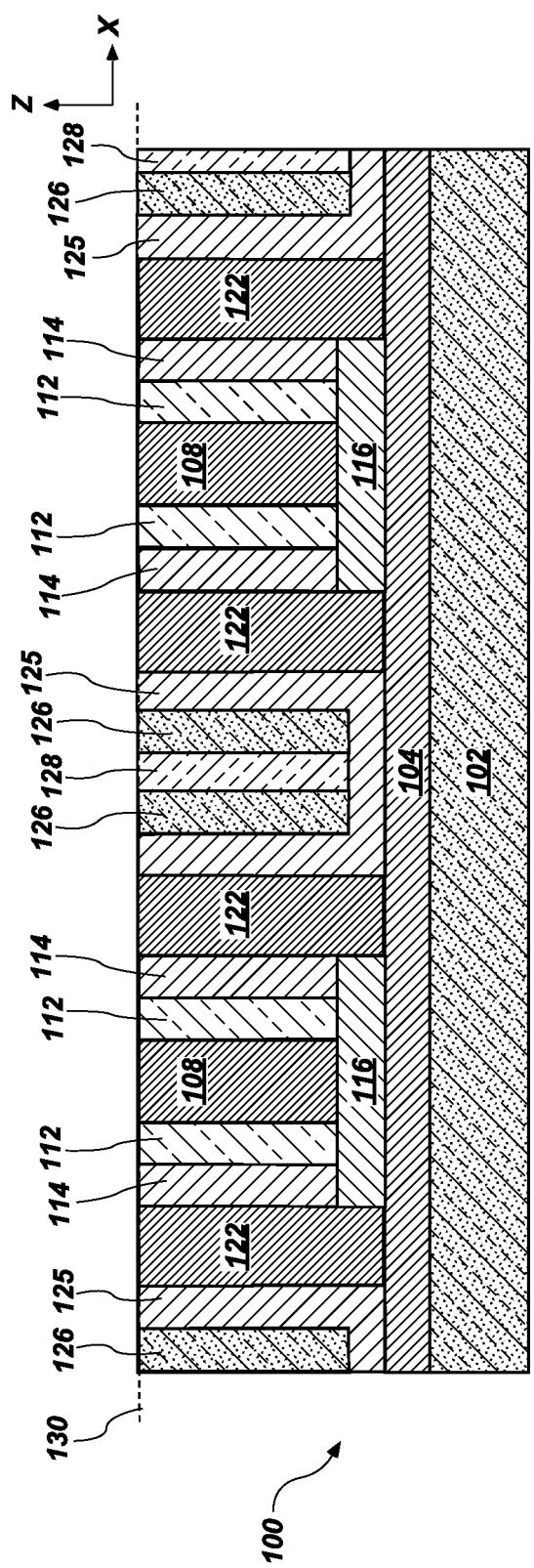
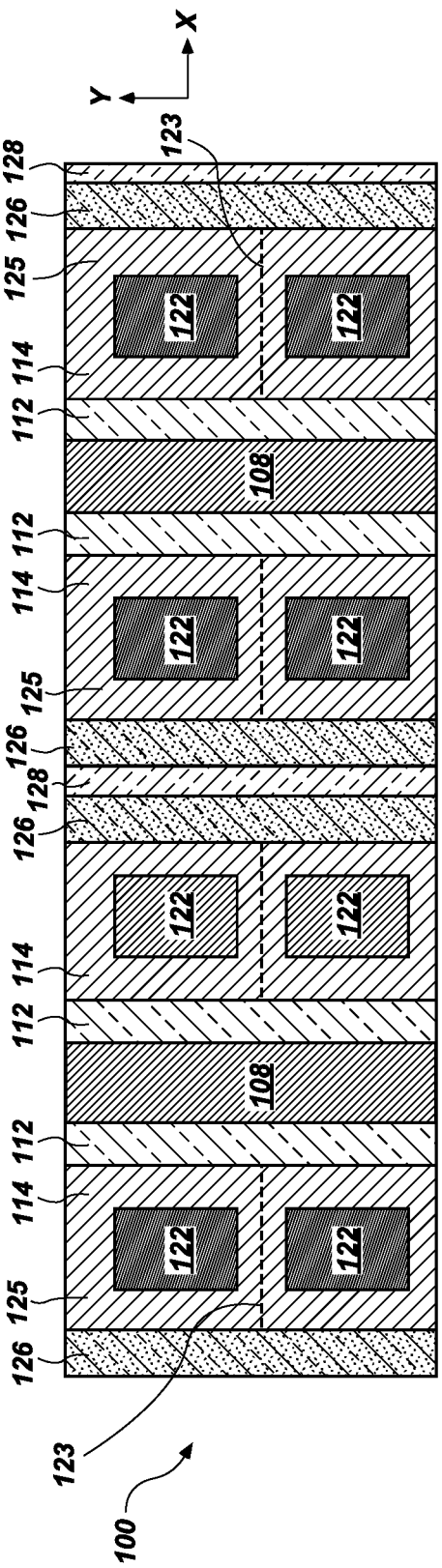
FIG. 11A
FIG. 11B

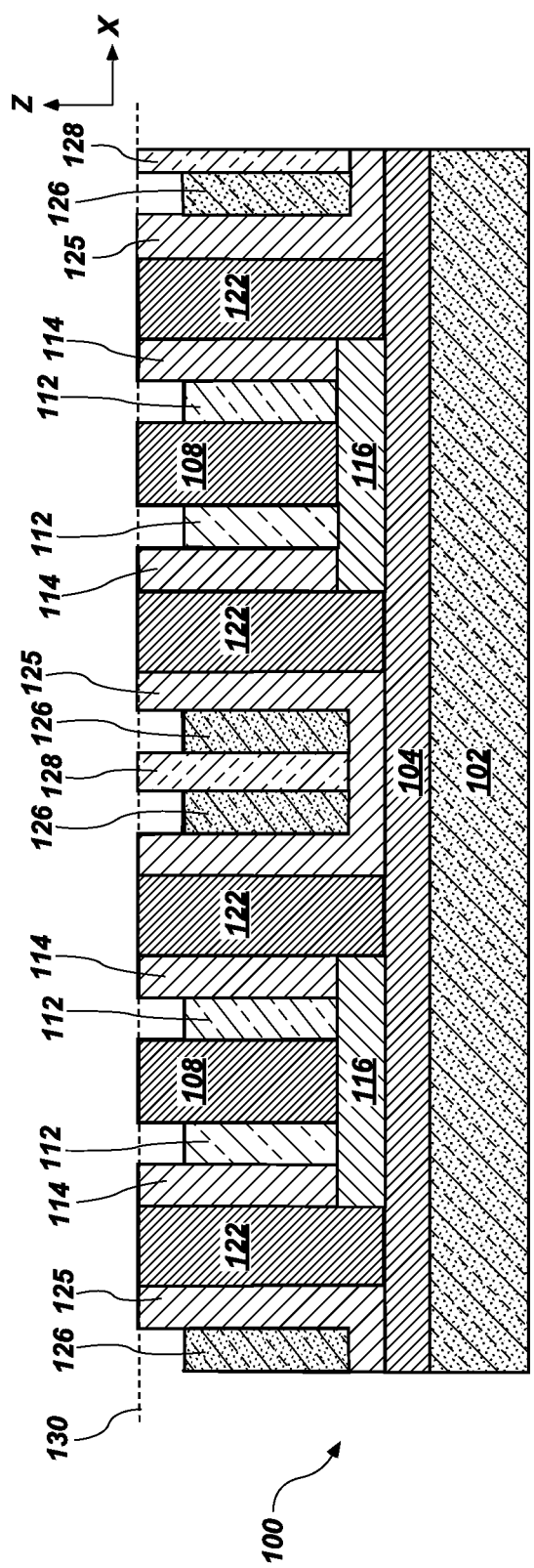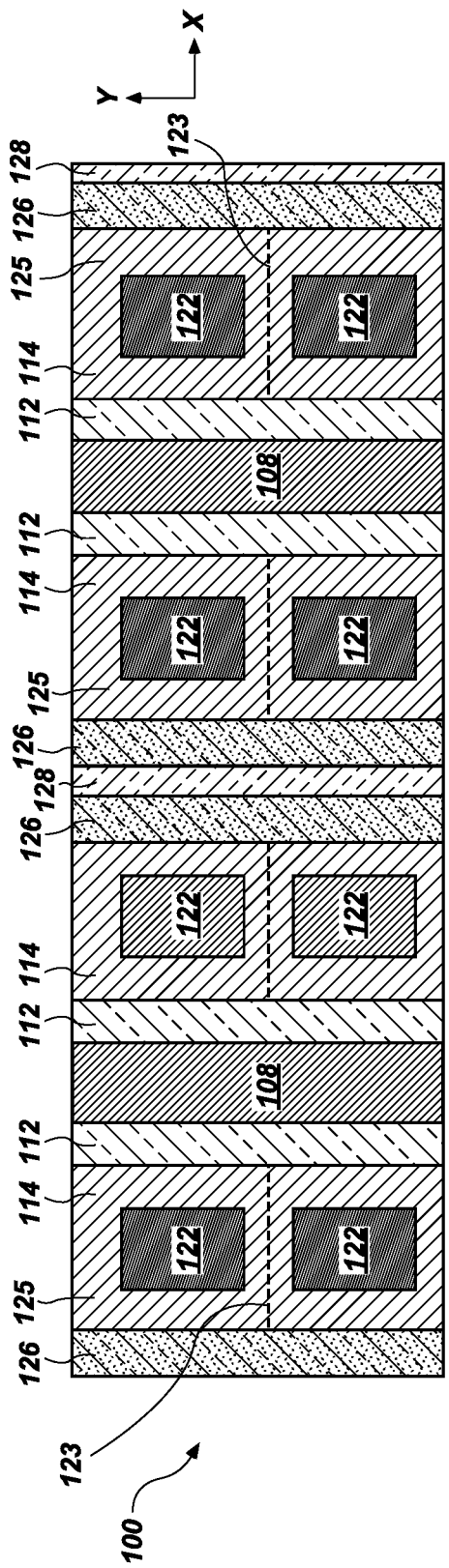

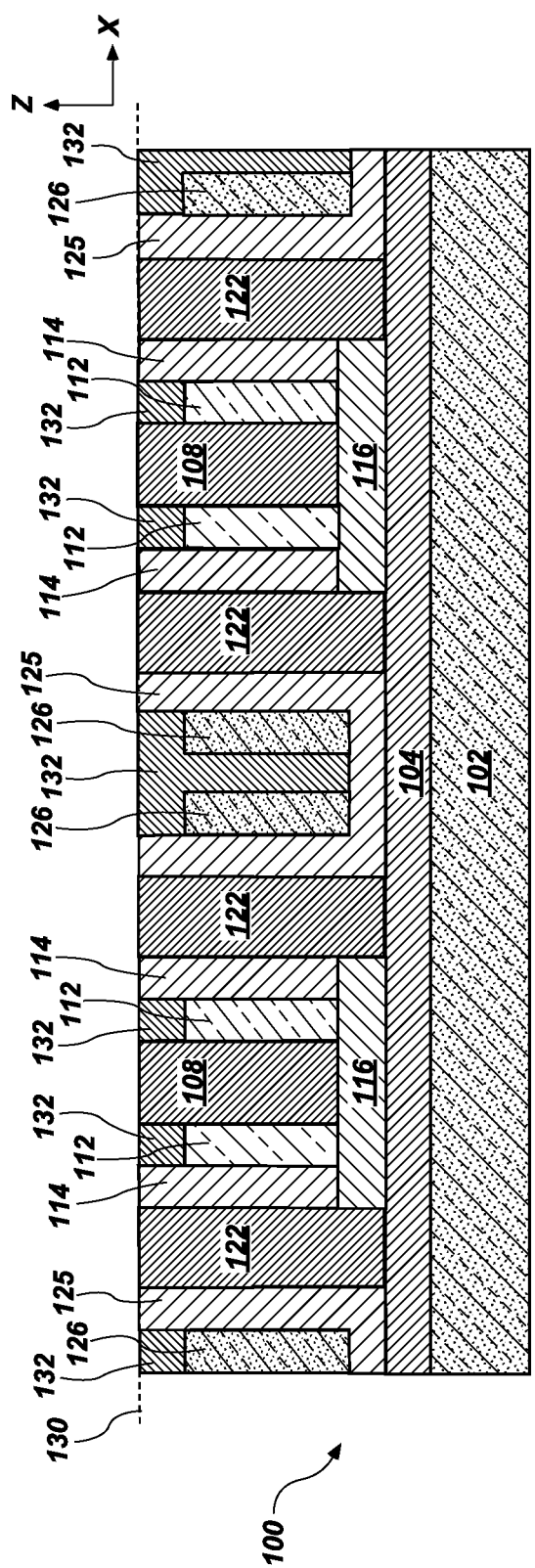
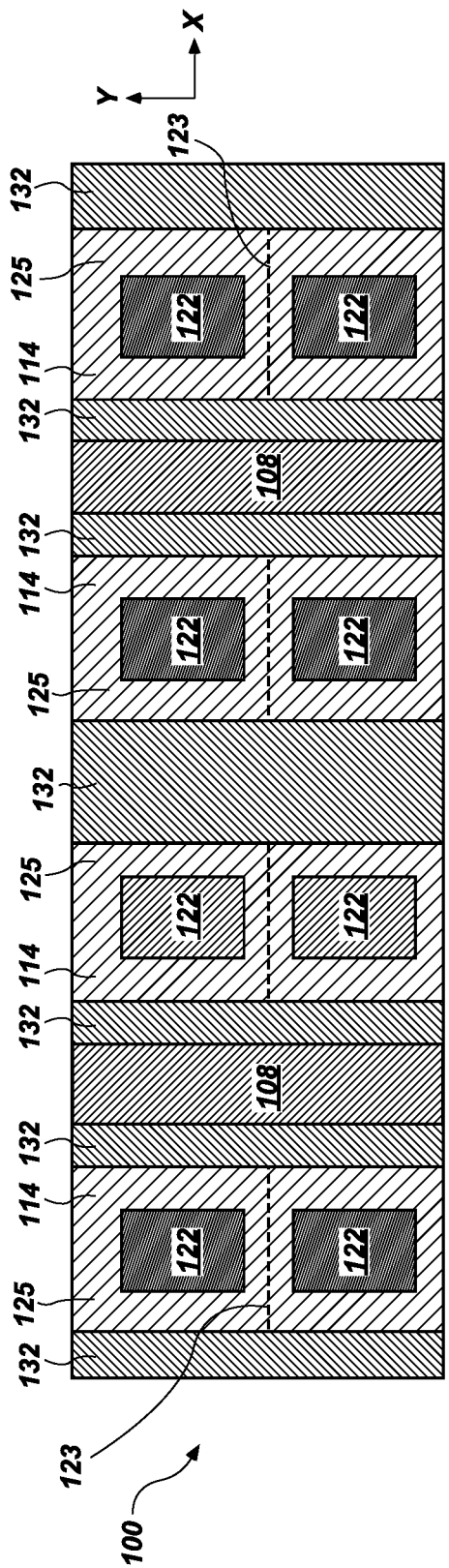
FIG. 13A
FIG. 13B

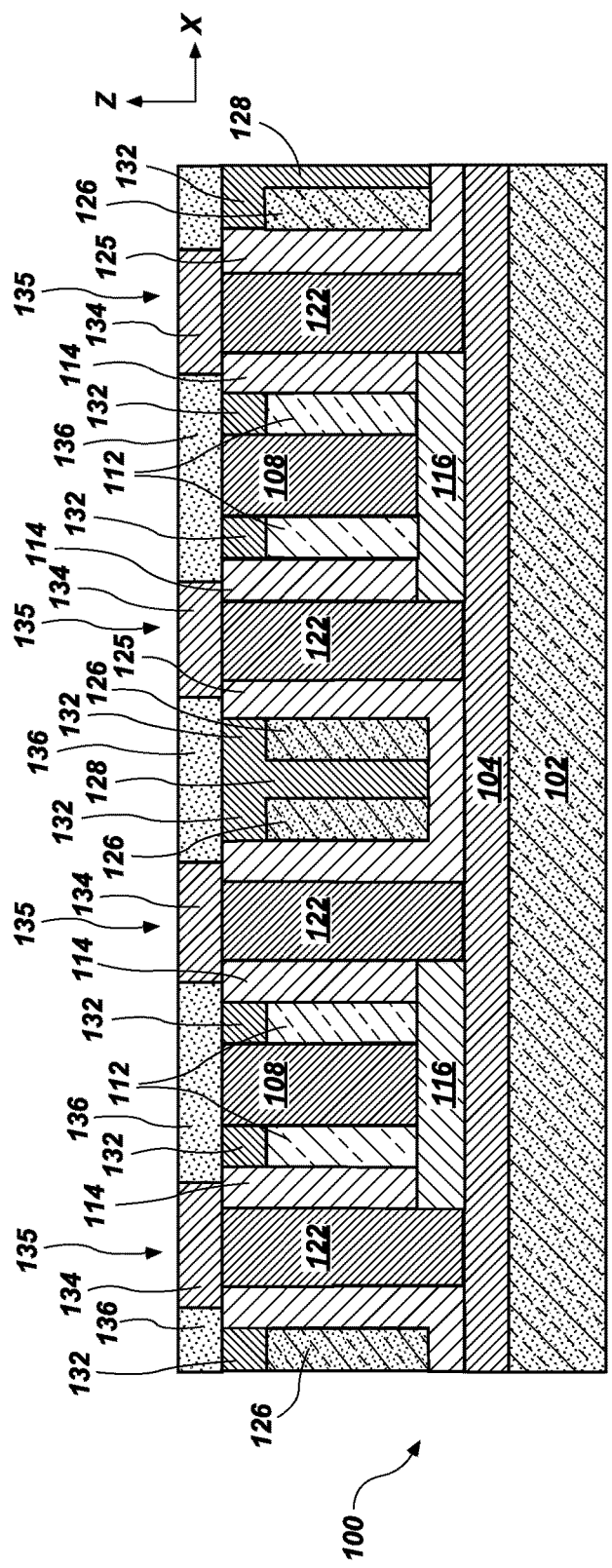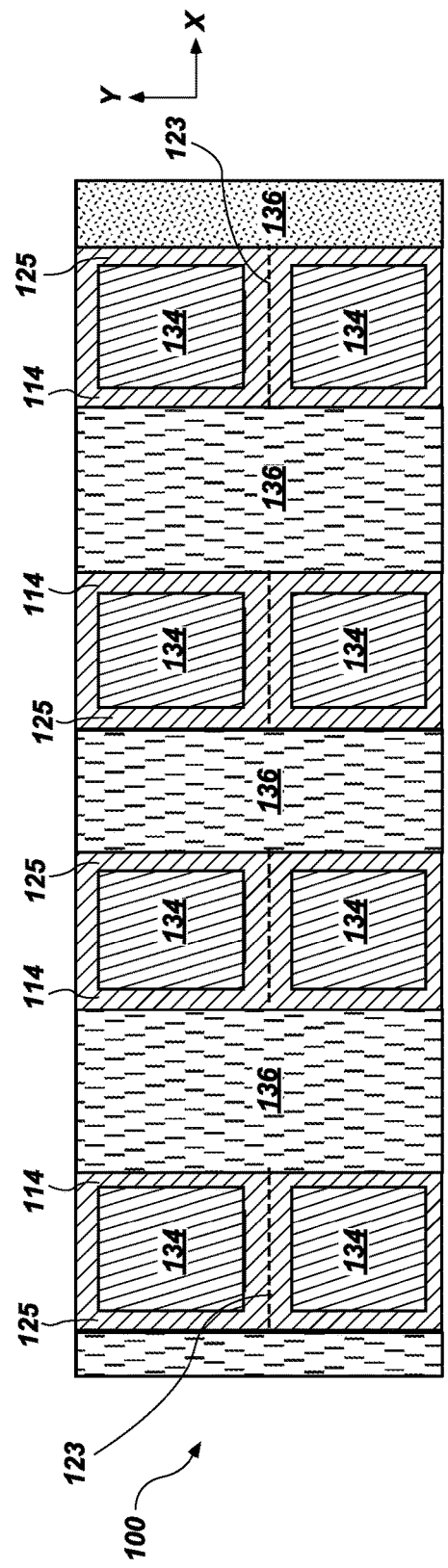
FIG. 14A
FIG. 14B

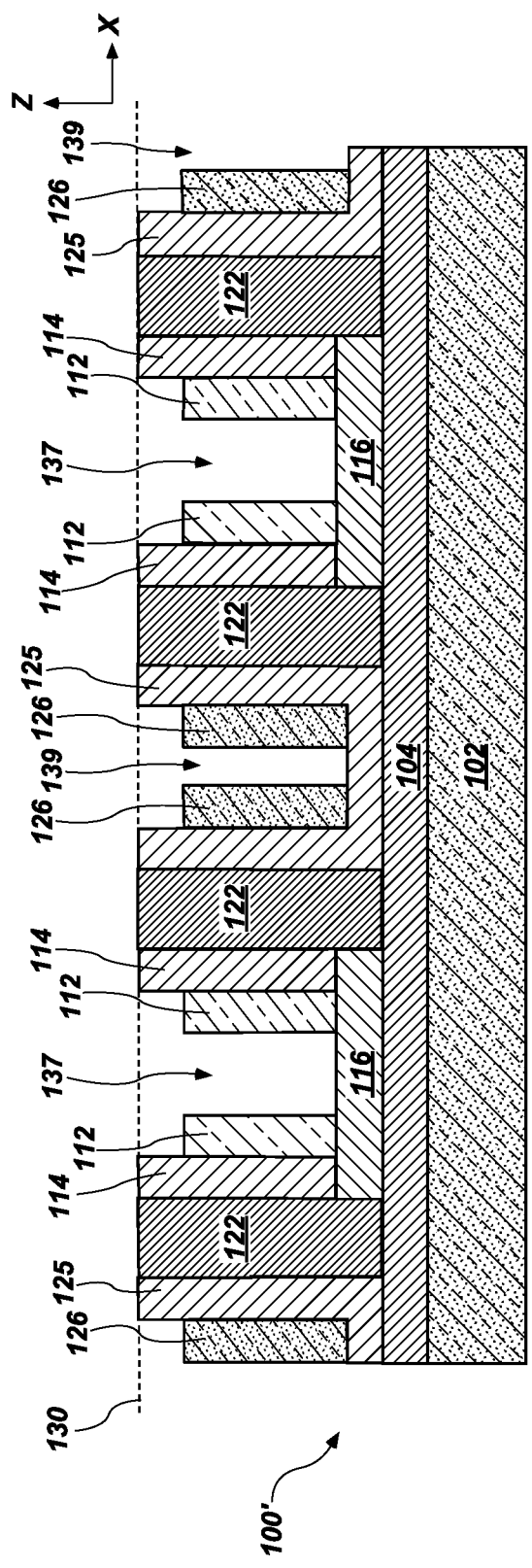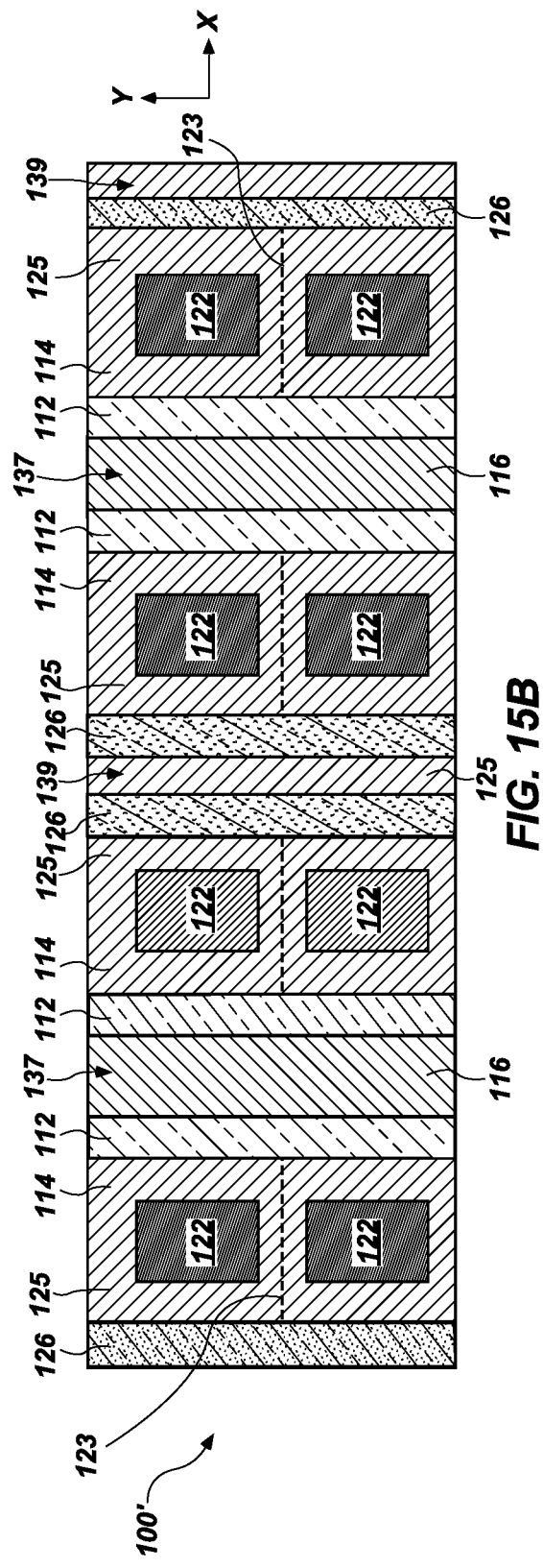
FIG. 15A
FIG. 15B

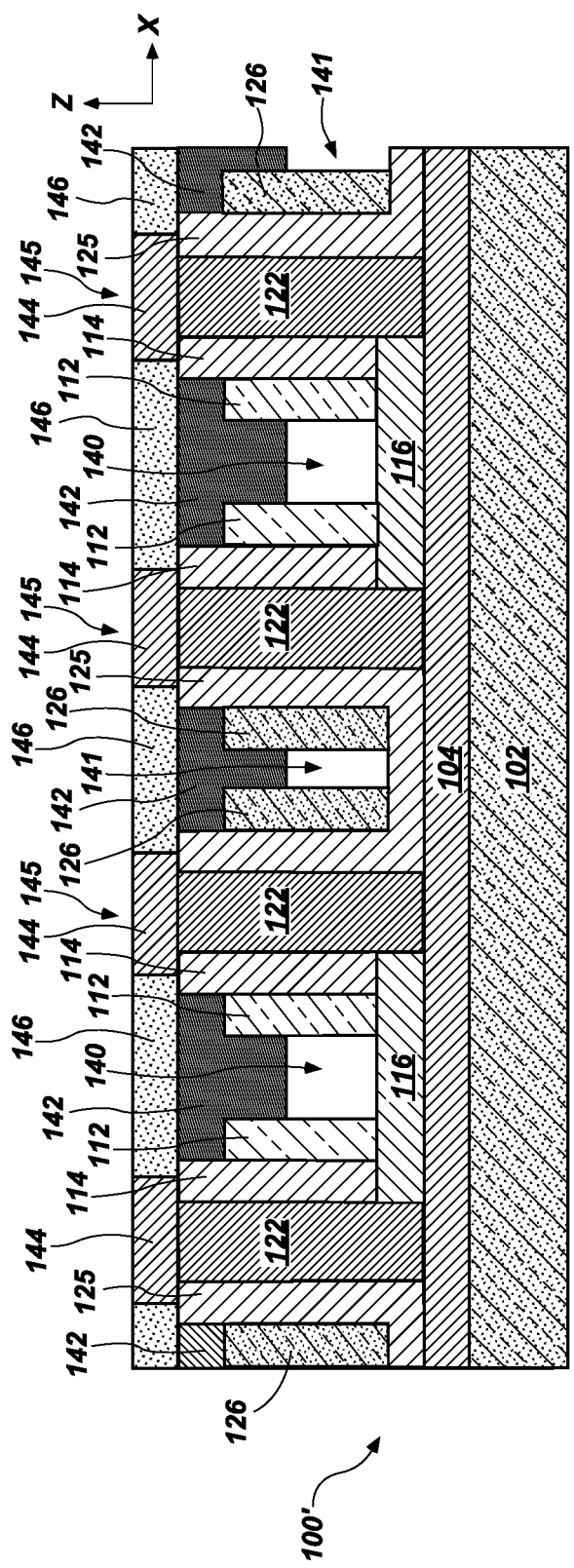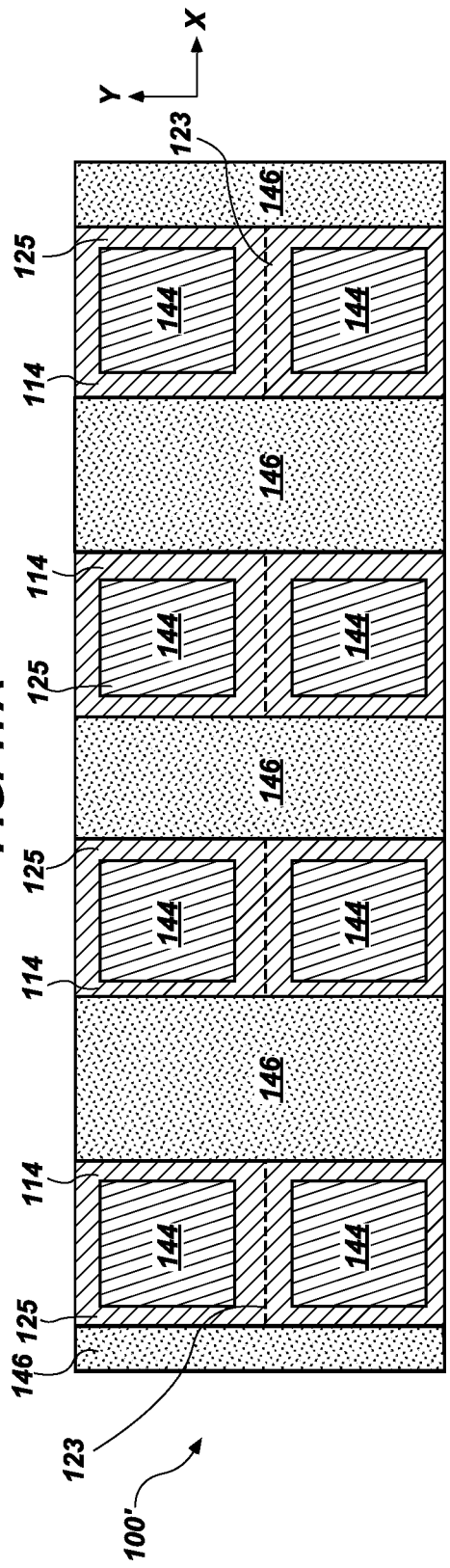
FIG. 17A
FIG. 17B

METHODS OF FORMING A SEMICONDUCTOR DEVICE

CROSS-REFERENCE TO RELATED APPLICATION

This application claims the benefit under 35 U.S.C. § 119(e) of U.S. Provisional Patent Application Ser. No. 62/743,108, filed Oct. 9, 2018, the disclosure of which is hereby incorporated herein in its entirety by this reference.

TECHNICAL FIELD

Embodiments of the disclosure relate to the field of semiconductor device design and fabrication. More specifically, embodiments of the disclosure relate to methods of forming a semiconductor device, and to related semiconductor devices, memory devices, and electronic systems.

BACKGROUND

Semiconductor device designers often desire to increase the level of integration or density of features within a semiconductor device by reducing the dimensions of the individual features and by reducing the separation distance between neighboring features. In addition, semiconductor device designers often desire to design architectures that are not only compact, but offer performance advantages, as well as simplified designs.

One example of a semiconductor device is a memory device. Memory devices are generally provided as internal integrated circuits in computers or other electronic devices. There are many species of memory including, but not limited to, random-access memory (RAM), read-only memory (ROM), dynamic random access memory (DRAM), synchronous dynamic random access memory (SDRAM), ferroelectric random access memory (FeRAM), Flash memory, and resistance variable memory. Non-limiting examples of resistance variable memory include resistive random access memory (ReRAM), conductive bridge random access memory (conductive bridge RAM), magnetic random access memory (MRAM), phase change material (PCM) memory, phase change random access memory (PCRAM), spin-torque-transfer random access memory (STTRAM), oxygen vacancy-based memory, and programmable conductor memory.

A typical memory cell of a memory device includes an access device (e.g. a transistor) and a memory storage structure (e.g., a capacitor). The access device generally includes a channel region between a pair of source/drain regions, and a gate configured to electrically connect the source/drain regions to one another through the channel region. The access devices can comprise planar access devices or vertical access devices. Planar access devices can be distinguished from vertical access devices based upon the direction of current flow between the source and drain regions thereof. Current flow between the source and drain regions of a vertical access device is primarily substantially orthogonal (e.g., perpendicular) to a primary (e.g., major) surface of a substrate or base structure thereunder, and current flow between source and drain regions of a planar access device is primarily parallel to the primary surface of the substrate or base thereunder.

Many conventional access devices employ semiconductive materials such as silicon and polysilicon for the channels thereof. However, the use of such materials can result in some less desirable electrical properties in the access device (e.g., high off current ($I_{off}$), low electron carrier mobility, scattering at an interface between a gate oxide material and the channel). In addition, the relatively small band gaps of such materials can hinder (or even preclude) improvements to other electrical properties (e.g., higher on current ($I_{on}$), faster switching speed, lower operating voltage, reduced current leakage) of the access device. Other semiconductive materials, such as oxide semiconductor materials, have been investigated as alternatives for silicon and polysilicon for the channels of access devices. Such materials can have larger band gaps than silicon and polysilicon, and employing such materials can facilitate improved electrical properties (e.g., lower $I_{off}$) in the access devices. However, conventional methods of forming channels from oxide semiconductor materials can negatively affect the electrical properties of the access devices including the channels. For example, conventional methods of etching a bulk volume of oxide semiconductor material to form vertically-oriented channels (e.g., a channel pillar including the oxide semiconductor material) for vertical access devices can expose the oxide semiconductor material to etch chemistries (e.g., hydrogen containing plasmas) that can negatively impact current flow through the vertically-oriented channels, limiting the performance of the vertical access devices and of semiconductor devices (e.g., memory devices) employing the vertical access devices.

A need, therefore, exists for new methods of forming semiconductor devices, as well as for new semiconductor devices and electronic systems.

BRIEF DESCRIPTION OF THE SEVERAL VIEWS OF THE DRAWINGS

FIGS. 1A through 14B are simplified partial cross-sectional (FIGS. 1A, 2A, 3A, 4A, 5A, 6A, 7A, 8A, 9A, 10A, 11A, 12A, 13A, and 14A) and simplified partial plan (i.e., FIGS. 1B, 2B, 3B, 4B, 5B, 6B, 7B, 8B, 9B, 10B, 11B, 12B, 13B, and 14B) views illustrating embodiments of a method of forming a semiconductor device structure, in accordance with embodiments of the disclosure.

FIGS. 15A through 17B are simplified partial cross-sectional (FIGS. 15A, 16A, and, 17A) and simplified partial plan (i.e., FIGS. 15B, 16B, and 17B) views illustrating embodiments of a method of forming a semiconductor device structure, in accordance with additional embodiments of the disclosure.

DETAILED DESCRIPTION

Figure 3A:
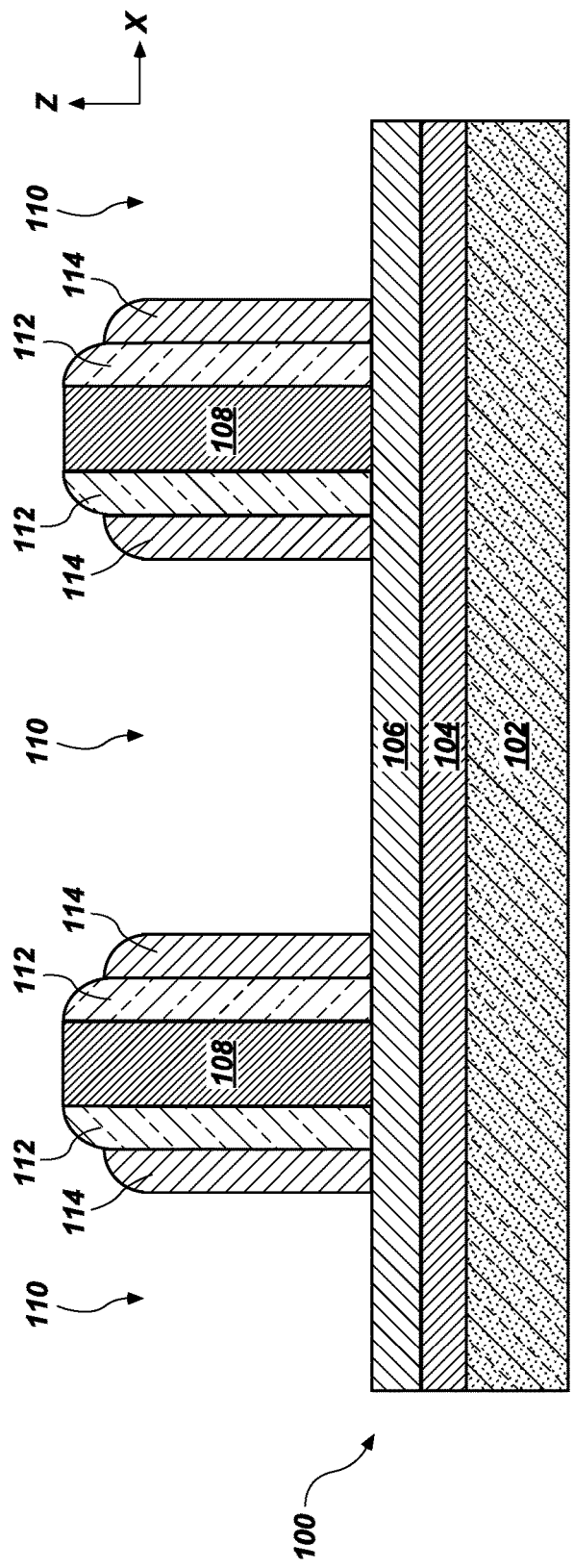

Methods of forming a semiconductor device are described, as are related semiconductor devices, memory devices, and electronic systems. In some embodiments, a method of forming a semiconductor device comprises forming dielectric support structures over dielectric line structures overlying conductive line contact structures (e.g., source contact structures). The dielectric support structures laterally extend in a direction orthogonal to another direction in which the conductive line contact structures extend, and are separated from one another by trenches. Conductive gate structures (e.g., gate electrodes) are formed on exposed side surfaces of the dielectric support structures within the trenches. Dielectric oxide structures (e.g., gate oxide structures) are formed on exposed side surfaces of the conductive gate structures within the trenches. Exposed (e.g., uncovered) portions of the dielectric line structures are removed to form isolation structures. Semiconductive pillars (e.g., channel pillars) are formed on exposed side surfaces of the dielectric oxide structures and the isolation structures within the trenches. Additional conductive contact structures (e.g., drain contact structures) are formed on upper surfaces of the semiconductive pillars. Optionally, additional dielectric oxide structures (e.g., additional gate oxide structures) and additional conductive gate structures (e.g., additional gate electrodes) may be formed over side surfaces of the semiconductive pillars prior to forming the additional conductive contact structures. In addition, air gaps may, optionally, be formed between at least some laterally neighboring conductive gate structures and/or between at least some laterally neighboring additional conductive gate structures (if any). The methods and structures of the disclosure may facilitate the formation of devices (e.g., access devices, semiconductor devices, memory devices) and systems (e.g., electronic systems) having one or more of increased performance, reduced off-state current, increased efficiency, increased reliability, and increased durability as compared to conventional devices (e.g., conventional access devices, conventional semiconductor devices, conventional memory devices) and conventional systems (e.g., conventional electronic systems).

The following description provides specific details, such as material species, material thicknesses, and processing conditions in order to provide a thorough description of embodiments of the disclosure. However, a person of ordinary skill in the art will understand that the embodiments of the disclosure may be practiced without employing these specific details. Indeed, the embodiments of the disclosure may be practiced in conjunction with conventional fabrication techniques employed in the industry. In addition, the description provided below does not form a complete process flow for manufacturing a semiconductor device (e.g., a memory device). The semiconductor device structures described below do not form a complete semiconductor device. Only those process acts and structures necessary to understand the embodiments of the disclosure are described in detail below. Additional acts to form the complete semiconductor device from the semiconductor device structures may be performed by conventional fabrication techniques. Also note, any drawings accompanying the application are for illustrative purposes only, and are thus not drawn to scale. Additionally, elements common between figures may retain the same numerical designation.

As used herein, the term "substrate" means and includes a base material or construction upon which additional materials are formed. The substrate may be a semiconductor substrate, a base semiconductor layer on a supporting structure, a metal electrode, or a semiconductor substrate having one or more layers, structures or regions formed thereon. The substrate may be a conventional silicon substrate or other bulk substrate comprising a layer of semiconductive material. As used herein, the term "bulk substrate" means and includes not only silicon wafers, but also silicon-on-insulator (SOI) substrates, such as silicon-on-sapphire (SOS) substrates and silicon-on-glass (SOG) substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped. By way of non-limiting example, a substrate may comprise at least one of silicon, silicon dioxide, silicon with native oxide, silicon nitride, a carbon-containing silicon nitride, glass, semiconductor, metal oxide, metal, titanium nitride, carbon-containing titanium nitride, tantalum, tantalum nitride, carbon-containing tantalum nitride, niobium, niobium nitride, carbon-containing niobium nitride, molybdenum, molybdenum nitride, carbon-containing molybdenum nitride, tungsten, tungsten nitride, carbon-containing tungsten nitride, copper, cobalt, nickel, iron, aluminum, and a noble metal.

As used herein, the term "configured" refers to a size, shape, material composition, material distribution, orientation, and arrangement of one or more of at least one structure and at least one apparatus facilitating operation of one or more of the structure and the apparatus in a predetermined way.

As used herein, the singular forms "a," "an," and "the" are intended to include the plural forms as well, unless the context clearly indicates otherwise.

As used herein, "and/or" includes any and all combinations of one or more of the associated listed items.

As used herein, the terms "longitudinal," "vertical," "lateral," and "horizontal" are in reference to a major plane of a substrate (e.g., base material, base structure, base construction, etc.) in or on which one or more structures and/or features are formed and are not necessarily defined by earth's gravitational field. A "lateral" or "horizontal" direction is a direction that is substantially parallel to the major plane of the substrate, while a "longitudinal" or "vertical" direction is a direction that is substantially perpendicular to the major plane of the substrate. The major plane of the substrate is defined by a surface of the substrate having a relatively large area compared to other surfaces of the substrate.

As used herein, "vertically neighboring" or "longitudinally neighboring" features (e.g., structures, devices) means and includes features located most vertically proximate vertically closest) one another. In addition, as used herein, "horizontally neighboring" or "laterally neighboring" features (e.g., structures, devices) means and includes features located most horizontally proximate (e.g., horizontally closest) one another.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped, etc.) and the spatially relative descriptors used herein interpreted accordingly.

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

FIGS. 1A through 14B are simplified partial cross-sectional (FIGS. 1A, 2A, 3A, 4A, 5A, 6A, 7A, 8A, 9A, 10A, 11A, 12A, 13A, and 14A) and simplified partial plan (i.e., FIGS. 1B, 2B, 3B, 4B, 5B, 6B, 7B, 8B, 9B, 10B, 11B, 12B, 13B, and 14B) views illustrating embodiments of a method of forming a semiconductor device structure (e.g., a memory structure) for a semiconductor device (e.g., a memory device, such as a DRAM device, an FeRAM device, an RRAM device, a conductive bridge RAM device, an MRAM device, a PCM device, a PCRAM device, a STTRAM device, an oxygen vacancy-based memory device, a programmable conductor memory device). With the description provided below, it will be readily apparent to one of ordinary skill in the art that the methods described herein may be used in various devices. In other words, the methods of the disclosure may be used whenever it is desired to form a semiconductor device.

Referring to collectively to FIGS. 1A and 1B, a semiconductor device structure 100 may include source lines 102, source line contacts 104 on or over the source lines 102, isolation lines 106 on or over the source line contacts 104, and linear dielectric structures 108 on or over the isolation lines 106. The source lines 102 may comprise at least one electrically conductive material, such as one or more of a metal, an alloy, a conductive metal oxide, a conductive metal nitride, a conductive metal silicide, and a conductively doped semiconductor material. By way of non-limiting example, the source lines 102 may be formed of and include one or more of tungsten (W), tungsten nitride (WN), nickel (Ni), tantalum (Ta), tantalum nitride (TaN), tantalum silicide (TaSi), platinum (Pt), copper (Cu), silver (Ag), gold (Au), aluminum (Al), molybdenum (Mo), titanium (Ti), titanium nitride (TiN), titanium silicide (TiSi), titanium silicon nitride (TiSiN), titanium aluminum nitride (TiAlN), molybdenum nitride (MoN), iridium (Ir), iridium oxide (IrO$_x$), ruthenium (Ru), ruthenium oxide (RuO$_x$), and conductively doped silicon. In some embodiments, the source lines 102 are formed of and include W. The source lines 102 may be positioned in, on, or over a substrate.

The source line contacts 104 may also comprise at least one electrically conductive material (e.g., one or more of a metal, an alloy, carbon, a conductive metal oxide, a conductive metal nitride, a conductive metal silicide, and a conductively doped semiconductor material). By way of non-limiting example, the source line contacts 104 may comprise one or more of W, WN, Ni, Ta, TaN, TaSi, Pt, Cu, Ag, Au, Al, Mo, Ti, TiN, TiSi, TiSiN, TiAlN, MoN, Ir, IrO$_x$, Ru, RuO$_x$, carbon (C), indium oxide (InO$_x$), molybdenum oxide (MoO$_x$), and conductively doped silicon. In some embodiments, the source line contacts 104 are formed of and include Ru. The source line contacts 104 may be formed on or over the source lines 102 to any desired thickness, and may substantially cover upper surfaces of the source lines 102.

The isolation lines 106 may be formed of and include at least one dielectric material, such as one or more of a dielectric oxide material (e.g., silicon dioxide; phosphosilicate glass; borosilicate glass; borophosphosilicate glass; fluorosilicate glass; aluminum oxide; high-k oxides, such as hafnium oxide (HfO$_x$); a combination thereof), a dielectric nitride material (e.g., silicon nitride (SiN)), a dielectric oxynitride material (e.g., silicon oxynitride (SiON)), a dielectric carbonitride material (e.g., silicon carbonitride (SiCN)), and a dielectric carboxynitride material (e.g., silicon carboxynitride (SiOCN)), and amphorous carbon. In some embodiments, the isolation lines 106 comprise SiN. The isolation lines 106 may be formed on or over the source line contacts 104 to any desired thickness, and may substantially cover upper surfaces of the source line contacts 104.

The linear dielectric structures 108 may serve as support structures for additional components (e.g., additional structures, additional materials) of the semiconductor device structure 100 to be subsequently formed, as described in further detail below. The linear dielectric structures 108 may be formed of and include at least one dielectric material, such as one or more of a dielectric oxide material (e.g., silicon dioxide; phosphosilicate glass; borosilicate glass; borophosphosilicate glass; fluorosilicate glass; aluminum oxide; high-k oxides, such as hafnium oxide (HfO$_x$); a combination thereof), a dielectric nitride material (e.g., SiN, a dielectric oxynitride material (e.g., SiON), a dielectric carbonitride material (e.g., SiCN), and a dielectric carboxynitride material (e.g., SiOCN), and amphorous carbon. A material composition of the linear dielectric structures 108 may be substantially the same as or may be different than that of the isolation lines 106. In some embodiments, the linear dielectric structures 108 comprise SiN.

The linear dielectric structures 108 may be laterally oriented perpendicular (e.g., orthogonal) to the source lines 102, the source line contacts 104, and the isolation lines 106. For example, as shown in FIG. 1A, the source lines 102, the source line contacts 104, and the isolation lines 106 may extend in a first lateral direction (e.g., the X-direction), and the linear dielectric structures 108 extend in a second lateral direction (e.g., the Y-direction) perpendicular to the first lateral direction as well as in a vertical direction (e.g., the Z-direction) perpendicular to both the first and second lateral directions. The linear dielectric structures 108 may be laterally separated (e.g., in the X-direction) from one another by trenches 110 (e.g., openings). The trenches 110 may vertically extend (e.g., in the Z-direction) from upper surfaces of the linear dielectric structures 108 to upper surfaces of the isolation lines 106. The semiconductor device structure 100 may include any desired quantities (e.g., amounts, numbers) of the linear dielectric structures 108 and the trenches 110.

The linear dielectric structures 108 and the trenches 110 may each individually be formed to exhibit any desired dimensions and spacing. The dimensions and spacing the linear dielectric structures 108 and the trenches 110 may be selected at least partially based on desired dimensions and desired spacing of additional components (e.g., additional structures, additional materials) of the semiconductor device structure 100 to be formed using the linear dielectric structures 108, as described in further detail below.

The source lines 102, the source line contacts 104, the isolation lines 106, and the linear dielectric structures 108 may be formed using conventional processes (e.g., conventional deposition processes, such as one or more of in situ growth, spin-on coating, blanket coating, chemical vapor deposition (CVD), plasma enhanced chemical vapor deposition (PECVD), atomic layer deposition (ALD), and physical vapor deposition (PVD); conventional material removal processes, such as conventional photolithography processes and conventional etching processes), which are not described in detail herein.

Referring to next to FIG. 2A, linear gate structures 112 (e.g., gate electrodes) may be formed on or over opposing sidewalls of each of the linear dielectric structures 108. The linear gate structures 112 may partially fill the trenches 110, such that linear gate structures 112 on laterally neighboring linear dielectric structures 108 are separated from one another by remainders of the trenches 110. FIG. 2B is a simplified partial plan view of the semiconductor device structure 100 at the process stage depicted in FIG. 2A.

The linear gate structures 112 may be formed of and include at least one electrically conductive material, such as one or more of a metal, a metal alloy, a conductive metal oxide, a conductive metal nitride, a conductive metal silicide, and a conductively doped semiconductor material. The linear gate structures 112 may, for example, be formed of and include one or more of W, WN, Ni, Ta, TaN, TaSi, Pt, Cu, Ag, Au, Al, Mo, Ti, TiN, TiSi, TiSiN, TiAlN, MoN, Ir, $IrO_x$, Ru, $RuO_x$, and conductively doped silicon. The material composition of the linear gate structures 112 may be the same as or may be different than the material composition of one or more of the source lines 102 and the source line contacts 104. In at least some embodiments, the linear gate structures 112 are formed of and include TiN. In addition, the linear gate structures 112 may each be formed at any suitable width (e.g., lateral dimension in the X-direction). By way of non-limiting example, each of the linear gate structures 112 may be formed to have a width within a range of from about 5 nm to about 15 nm, such as from about 5 nm to about 10 nm, or from about 10 nm to about 15 nm. In some embodiments, each of the linear gate structures 112 is formed to have width a within a range of from about 5 nm to about 10 nm.

The linear gate structures 112 may be formed using conventional processes and conventional processing equipment, which are not described in detail herein. By way of non-limiting example, a gate material may be conformally formed (e.g., deposited through one or more of a PVD process, a CVD process, an ALD process, and a spin-coating process) over exposed surfaces of the linear dielectric structures 108 and the isolation lines 106, and then an anisotropic etching process may be performed to remove the gate material from upper surfaces of the linear dielectric structures 108 and from portions of the upper surfaces of the isolation lines 106 underlying central portions of the trenches 110, while maintaining the gate material on the opposing sidewalls of the linear dielectric structures 108 to form the linear gate structures 112.

Figure 3B:
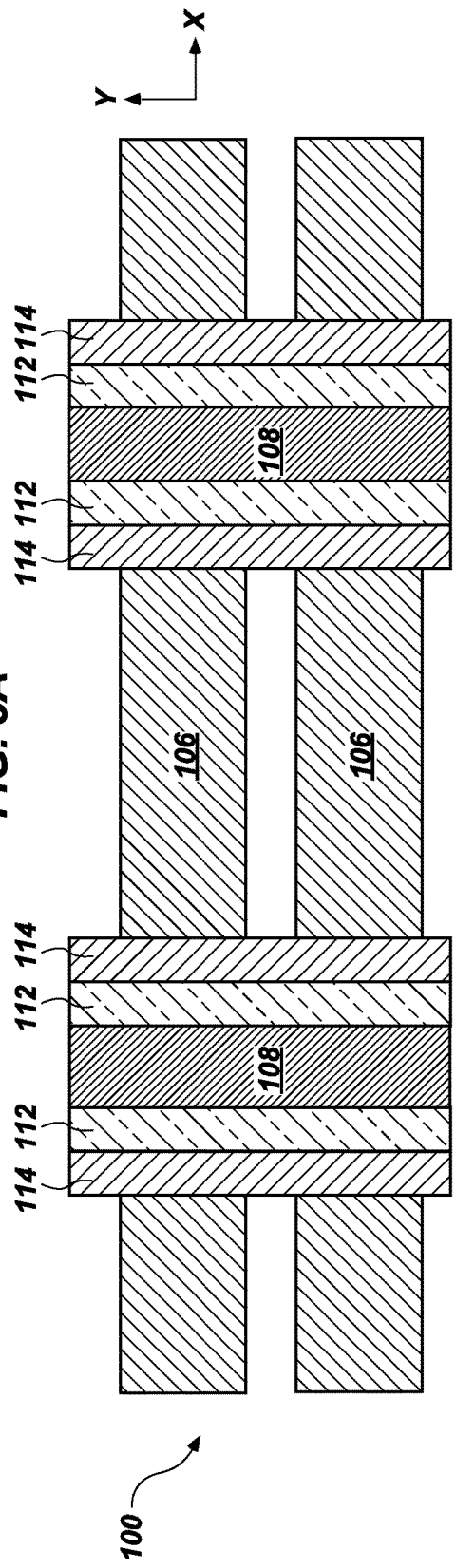

Referring to next to FIG. 3A, linear oxide structures 114 (e.g., gate oxide structures) may be formed on or over exposed (e.g., uncovered, bare) sidewalls of each of the linear gate structures 112. The linear oxide structures 114 may further partially fill the trenches 110, such that linear oxide structures 114 laterally adjacent laterally neighboring linear dielectric structures 108 are separated from one another by remainders of the trenches 110. The linear oxide structures 114 may be formed of and include at least one dielectric oxide material, such as one or more of silicon dioxide, phosphosilicate glass, borosilicate glass, borophosphosilicate glass, fluorosilicate glass, aluminum oxide, and a high-k oxide (e.g., hafnium oxide ($HfO_x$), niobium oxide ($NbO_x$), titanium oxide ($TiO_x$)). In some embodiments, the linear oxide structures 114 are formed of silicon dioxide. FIG. 3B is a simplified partial plan view of the semiconductor device structure 100 at the process stage depicted in FIG. 3A.

The dimensions and spacing of the linear oxide structures 114 (and, hence, the dimensions and spacing of remaining portions of the trenches 110) may be selected to provide desired dimensions and spacing to additional structures to be formed in the remaining portions of the trenches 110. The linear oxide structures 114 may, for example, be laterally sized (e.g., in the X-direction) and laterally spaced (e.g., in the X-direction) to facilitate the formation of linear channel material structures exhibiting desired lateral dimensions and desired lateral spacing, as described in further detail below. By way of non-limiting example, each of the linear oxide structures 114 may be formed to have a width (e.g., in the X-direction) less than or equal to about 20 nm, such as less than or equal to about 10 nm, or less than or equal to about 5 nm. In some embodiments, each of the linear oxide structures 114 is formed to have width a within a range of from about 5 nm to about 10 nm.

The linear oxide structures 114 may be formed using conventional processes and conventional processing equipment, which are not described in detail herein. By way of non-limiting example, a dielectric oxide material may be conformally formed (e.g., deposited through one or more of a PVD process, a CVD process, an ALD process, and a spin-coating process) over exposed surfaces of the linear gate structures 112, the linear dielectric structures 108, and the isolation lines 106, and then an anisotropic etching process may be performed to remove the gate material from upper surfaces of the linear gate structures 112 and the linear dielectric structures 108, and from portions of the upper surfaces of the isolation lines 106 underlying central portions of the trenches 110, while maintaining the dielectric oxide material on sidewalls of the linear gate structures 112 to form the linear oxide structures 114.

Figure 4A:
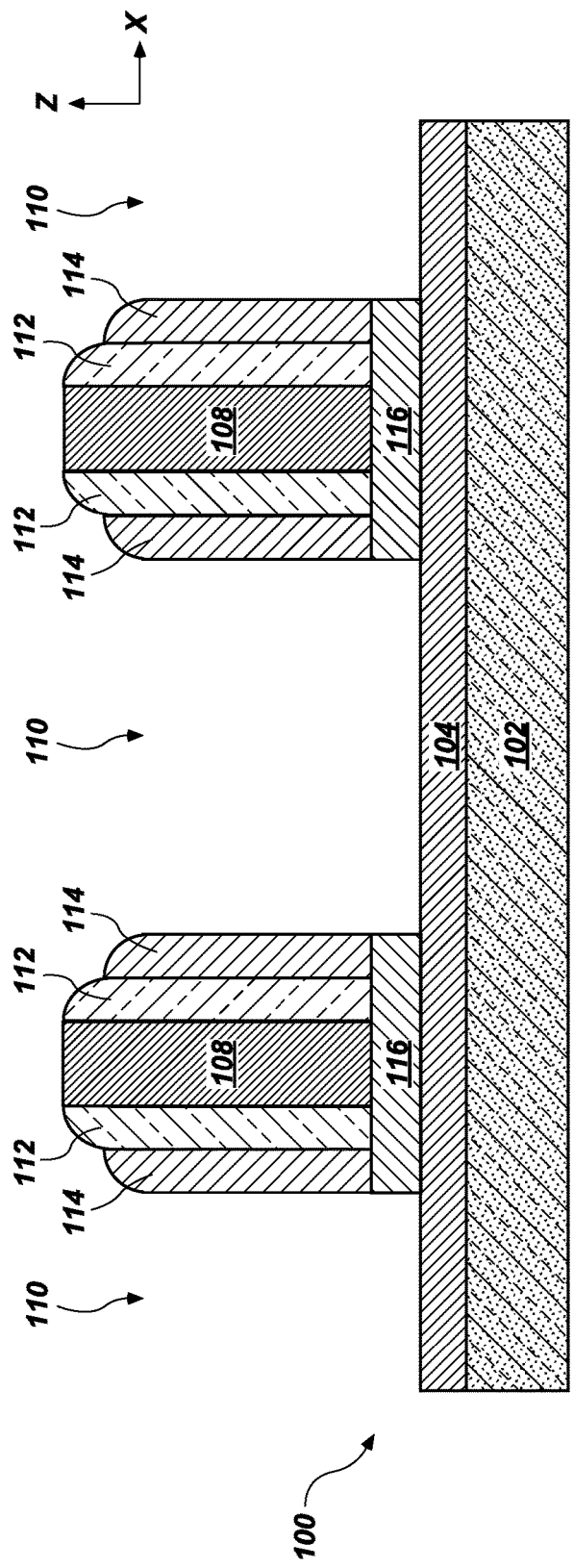
Figure 4B:
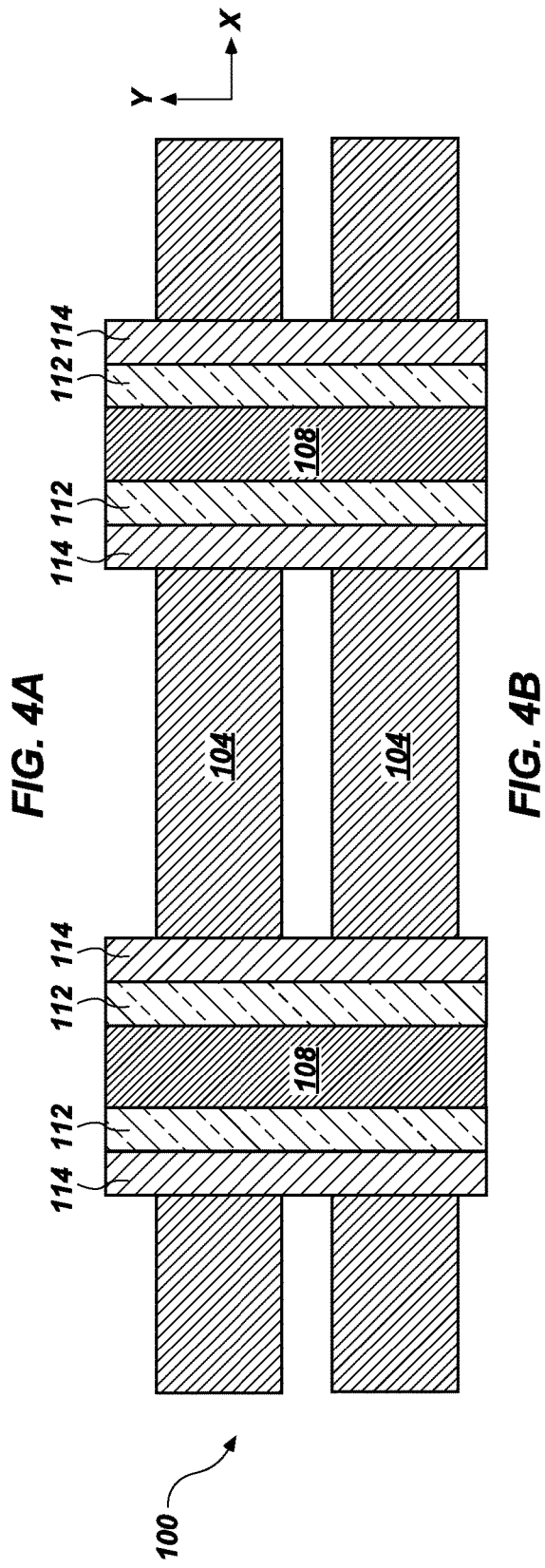

Referring next to FIG. 4A, portions of the isolation lines 106 (FIGS. 3A and 3B) may be removed to form isolation structures 116 therefrom. As shown in FIG. 4A, sidewalls of the isolation structures 116 may be substantially coplanar with sidewalls (e.g., laterally outermost sidewalls in the X-direction) of the linear oxide structures 114 thereover. FIG. 4B is a simplified partial plan view of the semiconductor device structure 100 at the process stage depicted in FIG. 4A.

At least one selective material removal process may be used to form the isolation structures 116. The selective material removal process may remove exposed portions of the isolation lines 106 (FIGS. 3A and 3B) without substantially removing portions of the source lines 102, the source line contacts 104, the linear dielectric structures 108, the linear gate structures 112, and the linear oxide structures 114. Suitable selective material removal processes (e.g., masking and etching processes) are known in the art, and are not described in detail herein.

Figure 5A:
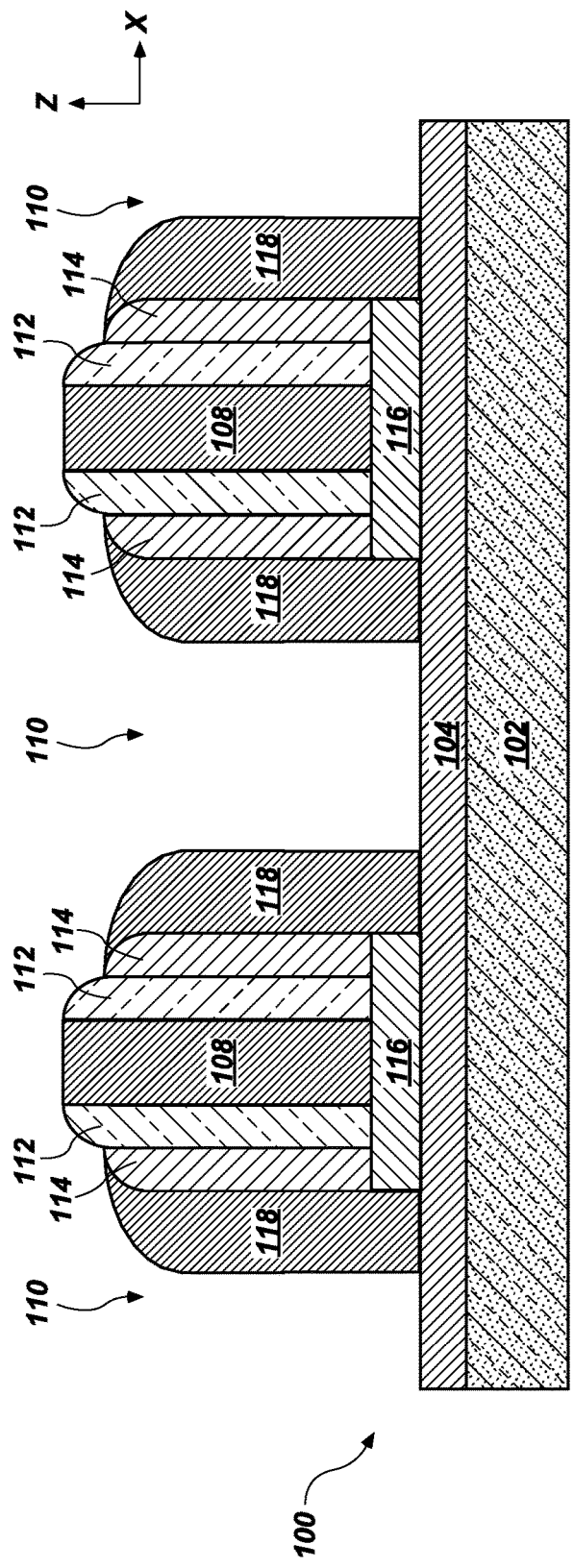
Figure 5B:
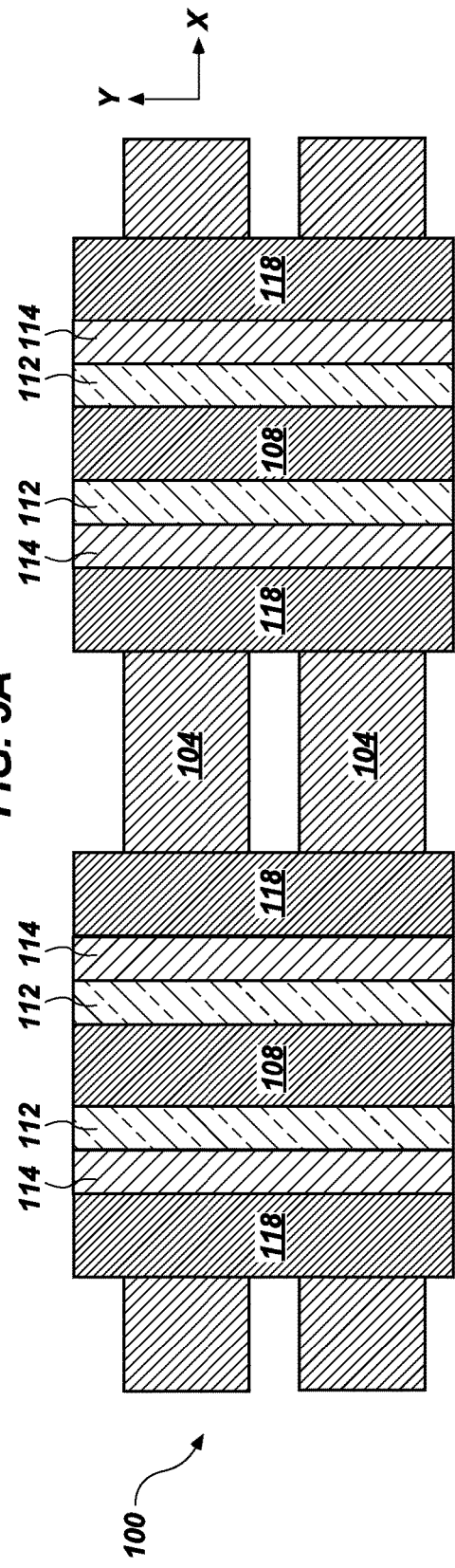

Referring to next to FIG. 5A, linear channel material structures 118 may be formed on or over exposed (e.g., uncovered, bare) sidewalls the linear oxide structures 114 and the isolation structures 116. As shown in FIG. 5A, the linear channel material structures 118 may vertically extend (e.g., in the Z-direction) from upper surfaces of the source line contacts 104 to upper surfaces of the linear oxide structures 114. The linear channel material structures 118 may further partially fill the trenches 110, such that linear channel material structures 118 between laterally neighboring linear dielectric structures 108 are separated from one another by remainders of the trenches 110. FIG. 5B is a simplified partial plan view of the semiconductor device structure 100 at the process stage depicted in FIG. 5A.

The linear channel material structures 118 may be formed of and include a semiconductive material including at least one region having a band gap larger than that polycrystalline silicon, such as a band gap larger than 1.65 electronvolts (eV). For example, the linear channel material structures 118 may comprise an oxide semiconductor material including one or more (e.g., one, two or more, three or more) of zinc tin oxide ($Zn_xSn_yO$, commonly referred to as "ZTO"), indium zinc oxide ($In_xZn_yO$, commonly referred to as "IZO"), zinc oxide ($Zn_xO$), indium gallium zinc oxide ($In_xGa_yZn_zO$, commonly referred to as "IGZO"), indium gallium silicon oxide ($In_xGa_ySi_zO$, commonly referred to as "IGSO"), indium tungsten oxide ($In_xW_yO$, commonly referred to as "IWO"), indium oxide ($In_xO$), tin oxide ($Sn_xO$), titanium oxide ($Ti_xO$), zinc oxide nitride ($Zn_xON_z$), magnesium zinc oxide ($Mg_xZn_yO$), zirconium indium zinc oxide ($Zr_xIn_yZn_zO$), hafnium indium zinc oxide ($Hf_xIn_yZn_zO$), tin indium zinc oxide ($Sn_xIn_yZn_zO$), aluminum tin indium zinc oxide ($Al_xSn_yIn_zZn_aO$), silicon indium zinc oxide ($Si_xIn_yZn_zO$), aluminum zinc tin oxide ($Al_xZn_ySn_zO$), gallium zinc tin oxide ($Ga_xZn_ySn_zO$), zirconium zinc tin oxide ($Zr_xZn_ySn_zO$), and other similar materials. Formulae including at least one of "x," "y," "z," and "a" above (e.g., $Zn_xSn_yO$, $In_xZn_yO$, $In_xGa_yZn_zO$, $In_xW_yO$, $In_xGa_ySi_zO$, $Al_xSn_yIn_zZn_aO$) represent a composite material that contains, throughout one or more regions thereof, an average ratio of "x" atoms of one element, "y" atoms of another element (if any), "z" atoms of an additional element (if any), and "d" atoms of a further element (if any) for every one atom of oxygen (O). As the formulae are representative of relative atomic ratios and not strict chemical structure, the linear channel material structures 118 may comprise one or more stoichiometric compounds and/or one or more non-stoichiometric compounds throughout the different regions thereof, and values of "x," "y," "z," and "a" may be integers or may be non-integers throughout the different regions thereof. As used herein, the term "non-stoichiometric compound" means and includes a chemical compound with an elemental composition that cannot be represented by a ratio of well-defined natural numbers and is in violation of the law of definite proportions.

Each of the linear channel material structures 118 may be substantially homogeneous or may be heterogeneous. In some embodiments, the linear channel material structures 118 are each substantially homogeneous, such that each linear channel material structure 118 exhibits a substantially uniform (e.g., even, non-variable) distribution of the elements thereof. For example, amounts (e.g., atomic concentrations) of each element (e.g., one or more metals, one or more metalloids, oxygen) included in the linear channel material structure 118 may not vary throughout the dimensions (e.g., lateral dimensions, vertical dimensions) of the linear channel material structure 118. In additional embodiments, the linear channel material structures 118 are each substantially heterogeneous, such that each linear channel material structure 118 exhibits a substantially non-uniform (e.g., non-even, variable) distribution of one or more of the elements thereof. For example, amounts (e.g., atomic concentrations) of one or more elements (e.g., one or more metals, one or more metalloids, oxygen) included in the linear channel material structure 118 may vary throughout at least a width (e.g., lateral dimension in the X-direction) of the linear channel material structure 118.

If the linear channel material structures 118 are laterally heterogeneous (e.g., exhibit a substantially non-uniform distribution of one or more elements in the X-direction), each linear channel material structure 118 may include substantially the same elements in different lateral regions thereof, or may include different elements in at least one lateral region thereof than in at least one other lateral region thereof. In some embodiments, each linear channel material structure 118 individually includes substantially the same elements in each of the different lateral regions thereof, but at least one of the different lateral regions includes a different atomic concentration of one or more of the elements than at least one other of the different lateral regions. For example, each linear channel material structure 118 may individually comprise a laterally heterogeneous form of a single (e.g., only one) oxide semiconductor material (e.g., only one of $Zn_xSn_yO$, $In_xZn_yO$, $Zn_xO$, $In_xGa_yZn_zO$, $In_xGa_ySi_zO_a$, $In_xW_yO$, $In_xO$, $Sn_xO$, $Ti_xO$, $Zn_xON_z$, $Mg_xZn_yO$, $In_xZn_yO$, $In_xGa_yZn_zO$, $Zr_xIn_yZn_zO$, $Hf_xIn_yZn_zO$, $Sn_xIn_yZn_zO$, $Al_xSn_yIn_zZn_aO$, $Si_xIn_yZn_zO$, $Zn_xSn_yO$, $Al_xZn_ySn_zO$, $Ga_xZn_ySn_zO$, $Zr_xZn_ySn_zO$, and $In_xGa_ySi_zO$), but atomic concentrations of one or more elements of the single oxide semiconductor material (and, hence, the relative atomic ratios of the formula thereof) may be different in at least two (2) different lateral regions thereof. In additional embodiments, each linear channel material structure 118 individually includes one or more different elements in at least one of the different lateral regions thereof than in at least one other of the different lateral regions thereof. For example, each linear channel material structure 118 may comprise a lateral stack of two or more (e.g., two, three, more than three) different oxide semiconductor materials (e.g., two or more of $Zn_xSn_yO$, $In_xZn_yO$, $Zn_xO$, $In_xGa_yZn_zO$, $In_xGa_ySi_zO_a$, $In_xO$, $Sn_xO$, $In_xW_yO$, $Ti_xO$, $Zn_xON_z$, $Mg_xZn_yO$, $In_xZn_yO$, $In_xGa_yZn_zO$, $Zr_xIn_yZn_zO$, $Hf_xIn_yZn_zO$, $Sn_xIn_yZn_zO$, $Al_xSn_yIn_zZn_aO$, $Si_xIn_yZn_zO$, $Zn_xSn_yO$, $Al_xZn_ySn_zO$, $Ga_xZn_ySn_zO$, $Zr_xZn_ySn_zO$, and $In_xGa_ySi_zO$).

The linear channel material structures 118 may be formed using conventional processes (e.g., conventional deposition processes, conventional material removal processes), which are not described in detail herein. By way of non-limiting example, a channel material (e.g., oxide semiconductor material) may be conformally formed (e.g., conformally deposited through one or more of an ALD process, a CVD process, a PECVD process, a PVD process, and a spin-coating process) over exposed surfaces of the linear oxide structures 114, the linear gate structures 112, the linear dielectric structures 108, the isolation structures 116, and the source line contacts 104. Thereafter, an anisotropic etching process may be performed to remove the channel material from upper surfaces of at least the linear gate structures 112 and the linear dielectric structures 108, and from portions of the upper surfaces of the source line contacts 104 underlying central portions of the trenches 110, while maintaining the channel material at least on sidewalls of the linear oxide structures 114 to form the linear channel material structures 118.

Figure 6A:
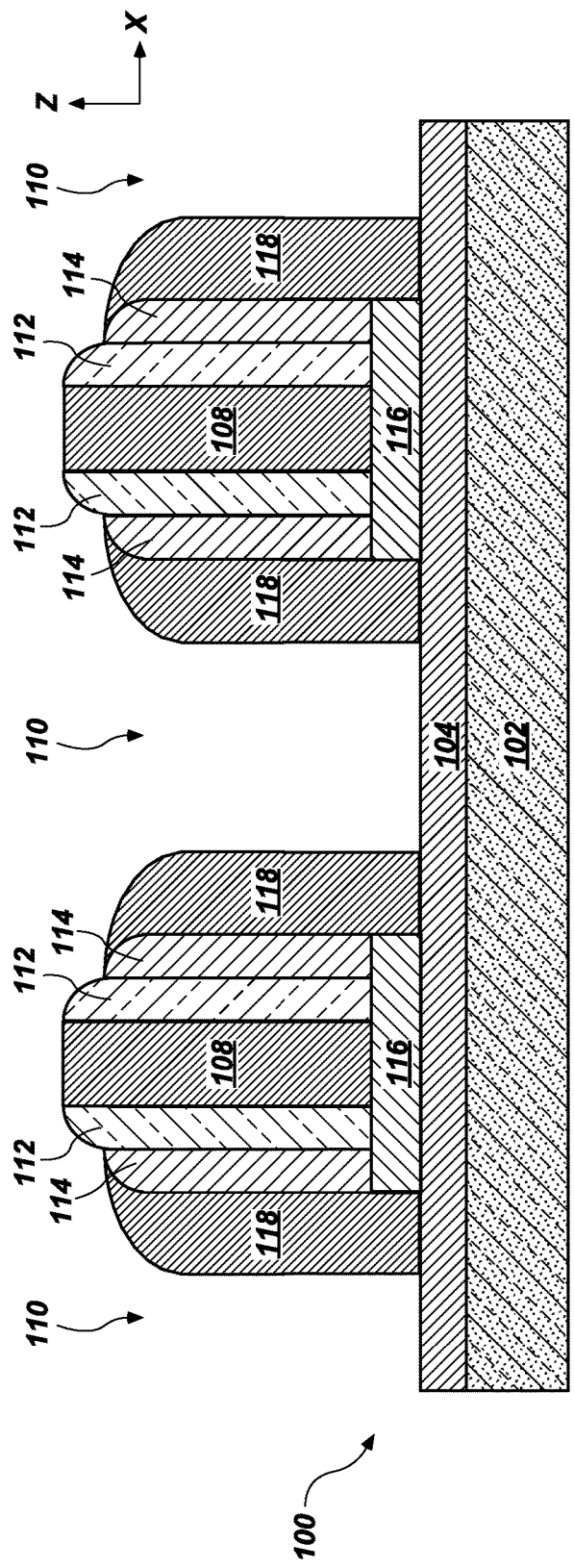
Figure 6B:
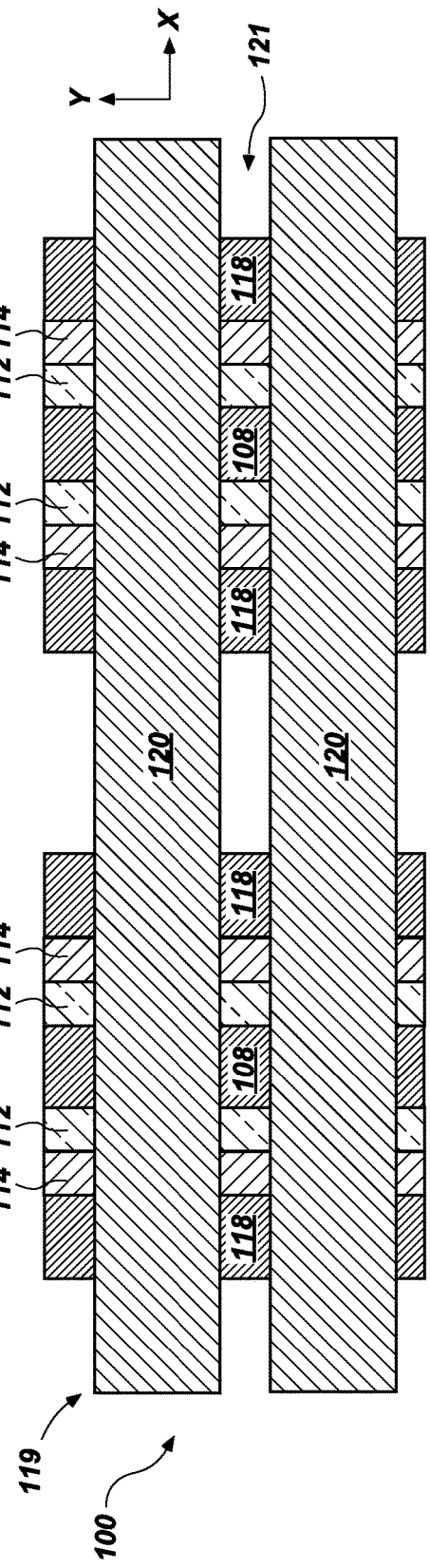

Next, referring collectively to FIGS. 6A and 6B, a mask structure 119 (FIG. 6B) may be provided over the semiconductive device structure 100. The mask structure 119 may be formed of and include at least one material suitable for use as an etch mask structure to pattern portions of the linear channel material structures 118, as described in further detail below. By way of non-limiting example, the mask structure 119 may be formed of and include at least one of amorphous carbon, silicon, a silicon oxide, a silicon nitride, a silicon oxycarbide, aluminum oxide, and a silicon oxynitride. The mask structure 119 may be homogeneous (e.g., may comprise a single material layer), or may be heterogeneous (e.g., may comprise a stack exhibiting at least two different material layers).

As shown in FIG. 6B, the mask structure 119 exhibits a desired pattern to be transferred to the linear channel material structures 118. For example, mask structure 119 may include linear mask structures 120, and linear apertures 121 (e.g., openings) laterally intervening (e.g., in the Y-direction) between the linear mask structures 120. The linear mask structures 120 and the linear apertures 121 may individually exhibit lateral dimensions, shapes, positions, and orientations facilitating desired lateral dimensions, shapes, positions, and orientations of features (e.g., pillar structures) and openings to be subsequently formed from and in the linear channel material structures 118. As shown in FIG. 6B, in some embodiments, each of the linear mask structures 120 exhibits substantially the same lateral dimensions (e.g., width, length), shape, spacing, and orientation as each other of the linear mask structures 120. Referring collectively to FIGS. 6A and 6B, each of the linear mask structures 120 (FIG. 6B) of the mask structure 119 (FIG. 6B) may individually be substantially aligned with and exhibit substantially the same lateral dimensions as one of the source lines 102 (FIG. 6A) (and, hence, one of the source line contacts 104 (FIG. 6A)) of the semiconductive device structure 100.

The mask structure 119, including the linear mask structures 120 and the linear apertures 121 thereof, may be formed and positioned using conventional processes (e.g., conventional deposition processes, such as at least one of in situ growth, spin-on coating, blanket coating, CVD, PECVD, ALD, and PVD; conventional photolithography processes; conventional material removal processes; conventional alignment processes) and conventional processing equipment, which are not described in detail herein.

Figure 7A:
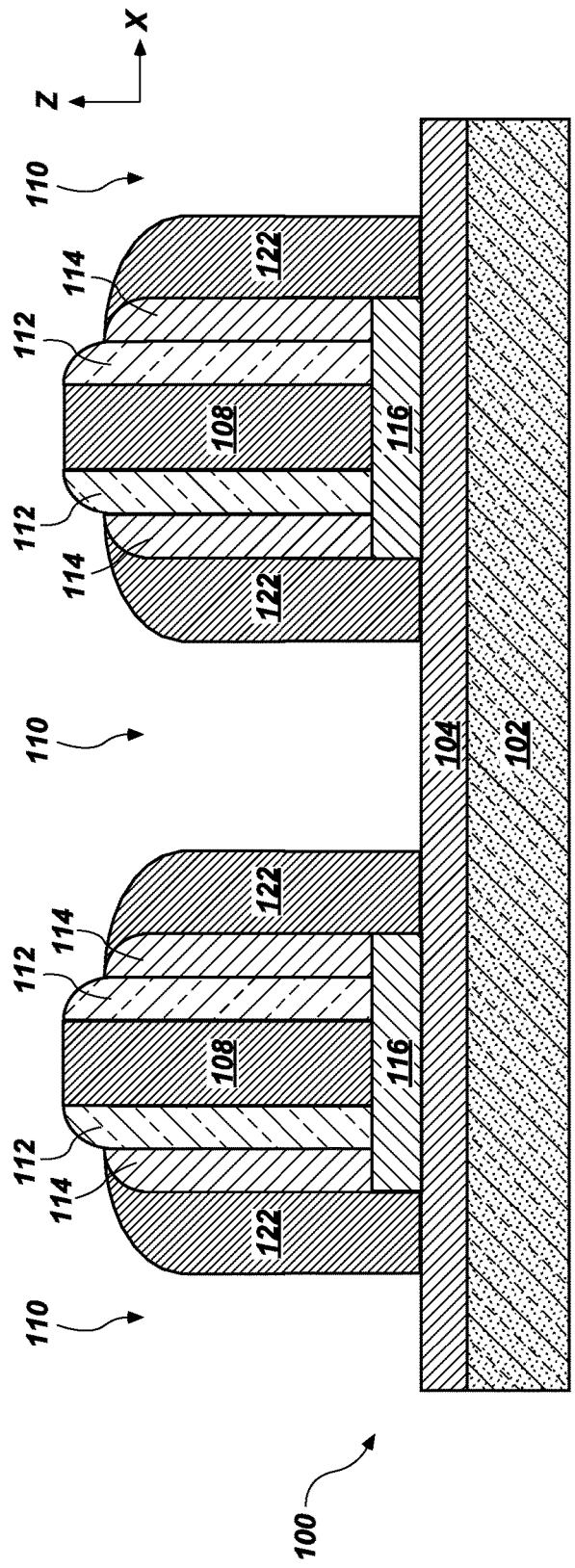
Figure 7B:
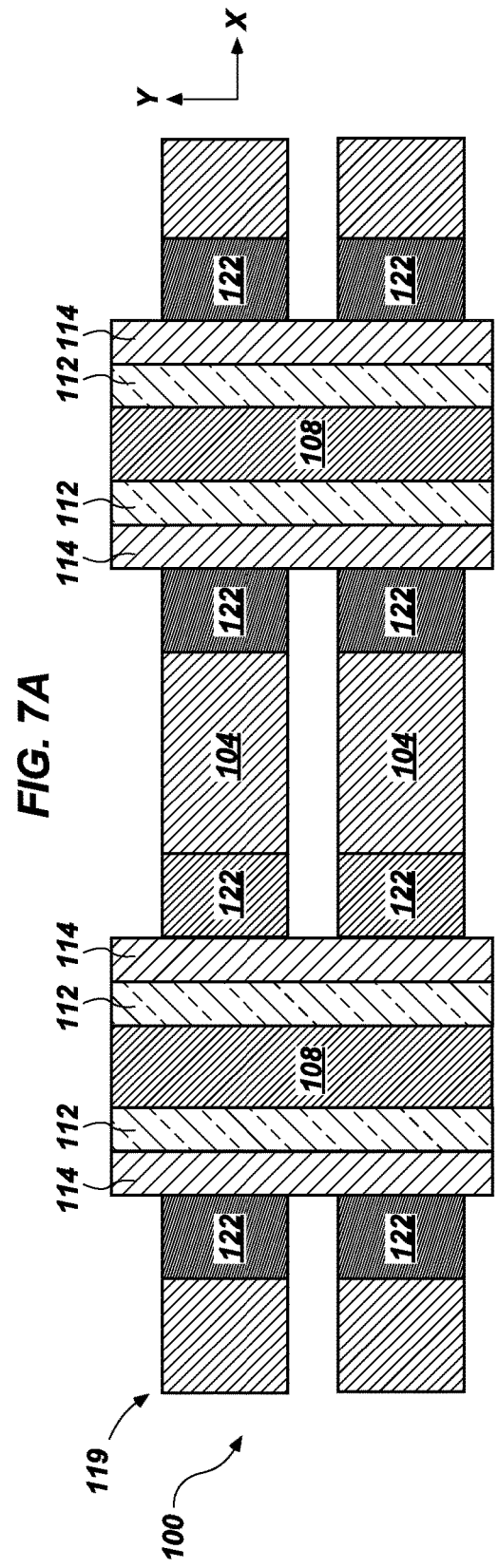

Referring next to FIG. 7A, portions of the linear channel material structures 118 (FIGS. 6A and 6B) remaining uncovered by the linear mask structures 120 (FIG. 6B) of the mask structure 119 (FIG. 6B) may be subjected to at least one material removal process to form channel pillars 122. The material removal process may transfer or extend a pattern defined by the linear apertures 121 (FIG. 6B) in the mask structure 119 (FIG. 6B) into the linear channel material structures 118 (FIGS. 6A and 6B). The material removal process may selectively remove the portions of the linear channel material structures 118 (FIGS. 6A and 6B) remaining uncovered by the linear mask structures 120 (FIG. 6B) of the mask structure 119 (FIG. 6B) relative to the linear oxide structures 114, the linear gate structures 112, the linear dielectric structures 108, and the source line contacts 104. In addition, as shown in FIG. 7A, following the formation of the channel pillars 122, the mask structure 119 (FIG. 6B) may be removed to expose surfaces of the channel pillars 122, the linear oxide structures 114, the linear gate structures 112, the linear dielectric structures 108, and the source line contacts 104 previously covered by the linear mask structures 120 (FIG. 6B) of mask structure 119 (FIG. 6B). FIG. 7B is a simplified partial plan view of the semiconductor device structure 100 at the process stage depicted in FIG. 7A.

As shown in FIG. 7B, the material removal process forms openings laterally intervening between (e.g., in the Y-direction) and separating laterally neighboring channel pillars 122 formed from the same linear channel material structures 118 (FIGS. 6A and 6B). The openings may exhibit substantially the same lateral dimensions (e.g., in the Y-direction), shapes, spacing, and orientations as the linear apertures 121 (FIG. 6B) of the mask structure 119 (FIG. 6B).

The material removal process employed to form the channel pillars 122 may comprise a conventional anisotropic etching process, which is not described in detail herein. For example, the material removal process may comprise exposing portions of the linear channel material structures 118 (FIGS. 6A and 6B) to one or more of anisotropic dry etching (e.g., reactive ion etching (RIE), deep RIE, plasma etching, reactive ion beam etching, chemically assisted ion beam etching) and anisotropic wet etching (e.g., hydrofluoric acid (HF) etching, a buffered HF etching, buffered oxide etching). In addition, remaining portions of the mask structure 119 (FIG. 6B) (if any) may be selectively removed following the formation of the channel pillars 122 using one or more other conventional material removal processes (e.g., a conventional wet etching process, a conventional dry etching process), which are not described in detail herein.

Next, referring to FIG. 8A, a gate oxide material 124 may be formed (e.g., conformally formed) on or over exposed surfaces of the channel pillars 122, the linear oxide structures 114, the linear gate structures 112, the linear dielectric structures 108, and the source line contacts 104. The gate oxide material 124 may further partially fill the trenches 110, and may also substantially fill the openings laterally intervening between (e.g., in the Y-direction) and separating laterally neighboring channel pillars 122. The gate oxide material 124 may be formed of and include at least one dielectric oxide material, such as one or more of silicon dioxide, phosphosilicate glass, borosilicate glass, borophosphosilicate glass, fluorosilicate glass, aluminum oxide, and a high-k oxide (e.g., $HfO_x$, $NbO_x$, $TiO_x$). A material composition of the gate oxide material 124 may be substantially same as or may be different than a material composition of the linear oxide structures 114. In some embodiments, the gate oxide material 124 comprises silicon dioxide. FIG. 8B is a simplified partial plan view of the semiconductor device structure 100 at the process stage depicted in FIG. 8A, wherein the gate oxide material 124 is depicted as transparent to show the other components of the semiconductor device structure 100 provided thereunder.

The gate oxide material 124 may be formed at any suitable thickness. The thickness of the gate oxide material 124 may be selected (e.g., tailored) to provide desired lateral offset in the X-direction between the channel pillars 122 and additional linear gate structures to be formed laterally adjacent thereto, as well as to provide desired vertical offset in the Z-direction between the additional gate structures and the source line contacts 104, as described in further detail below. By way of non-limiting example, each of the gate oxide material 124 may be formed such that portions thereof laterally adjacent sidewalls of the channel pillars 122 have a width in the X-direction less than or equal to about 20 nm, such as less than or equal to about 10 nm, or less than or equal to about 5 nm. The width in the X-direction of portions of the gate oxide material 124 laterally adjacent sidewalls of the channel pillars 122 may be substantially the same as or may be different than the width in the X-direction of each of the linear oxide structures 114.

Referring to FIG. 8B, the gate oxide material 124 may intervene between laterally neighboring channel pillars 122 in the Y-direction. In some embodiments, the gate oxide material 124 substantially fills in spaces between the laterally neighboring channel pillars 122, such that central regions 123 (shown in FIG. 8B with dashed line) between the laterally neighboring channel pillars 122 are substantially occupied (e.g., filled) by the gate oxide material 124. Accordingly, portions of the gate oxide material 124 intervening between laterally neighboring channel pillars 122 in the Y-direction may have greater lateral dimensions than portions of the gate oxide material 124 intervening between the channel pillars 122 and remainders of the trenches 110 in the X-direction. For example, lateral dimensions of portions of the gate oxide material 124 intervening between and separating laterally neighboring channel pillars 122 in the Y-direction may be about two (2) times (2×) greater than lateral dimensions additional portions of the gate oxide material 124 intervening between and separating the channel pillars 122 and remainders of the trenches 110 in the X-direction. In additional embodiments, the gate oxide material 124 does not substantially fill in the spaces between the laterally neighboring channel pillars 122, such that central regions 123 between the laterally neighboring channel pillars 122 remain at least partially unoccupied (e.g., unfilled) by the gate oxide material 124. Such a configuration of the gate oxide material 124 may, for example, permit additional gate structures to be subsequently formed to laterally extend over multiple sides (e.g., multiple sidewalls) of each of the channel pillars 122 to facilitate a so-called "gate-all-around" configuration, as described in further detail below. For example, portions of the additional gate structures may be formed to laterally extend in the X-direction through the central regions 123 remaining at least partially unoccupied with the gate oxide material 124, while additional portions of the additional gate structures are formed to laterally extend in the Y-direction (e.g., parallel to the linear gate structures 112).

The gate oxide material 124 may be formed on or over exposed surfaces of the channel pillars 122, linear oxide structures 114, the linear gate structures 112, the linear dielectric structures 108, and the source line contacts 104 using conventional processes (e.g., one or more of in situ growth, spin-on coating, blanket coating, CVD, PECVD, ALD, and PVD) and conventional processing equipment, which are not described in detail herein.

Referring to next to FIG. 9A, additional gate structures 126 (e.g., additional gate electrodes) may be formed on or over portions of the gate oxide material 124. The additional gate structures 126 may further partially fill the trenches 110, such that laterally neighboring (e.g., in the X-direction) additional gate structures 126 are separated from one another by remainders of the trenches 110. FIG. 9B is a simplified partial plan view of the semiconductor device structure 100 at the process stage depicted in FIG. 9A.

The additional gate structures 126 may be formed of and include at least one electrically conductive material, such as one or more of a metal, a metal alloy, a conductive metal oxide, a conductive metal nitride, a conductive metal silicide, and a conductively doped semiconductor material. The additional gate structures 126 may, for example, be formed of and include one or more of W, WN, Ni, Ta, TaN, TaSi, Pt, Cu, Ag, Au, Al, Mo, Ti, TiN, TiSi, TiSiN, TiAlN, MoN, Ir, $IrO_x$, Ru, $RuO_x$, and conductively doped silicon. The material composition of the linear gate structures 112 may be the same as or may be different than the material composition of one or more of the source lines 102, the source line contacts 104, and the linear gate structures 112. In at least some embodiments, the additional gate structures 126 are formed of and include TiN.

At least some portions of the additional gate structures 126 may be laterally oriented parallel to the linear gate structures 112 (and, hence, the linear dielectric structures 108). As shown in FIG. 9B, in some embodiments, such as embodiments wherein the central regions 123 in the Y-direction between laterally neighboring channel pillars 122 are substantially filled with the gate oxide material 124, the additional gate structures 126 and the linear gate structures 112 each substantially laterally extend in the Y-direction. In additional embodiments, such as embodiments wherein the central regions 123 are at least partially unfilled with the gate oxide material 124, portions of the additional gate structures 126 laterally extend in the Y-direction (e.g., in parallel to the linear gate structures 112), and additional portions of the additional gate structures 126 laterally extend in the X-direction (e.g., perpendicular to the linear gate structures 112).

The additional gate structures 126 may each be formed at any suitable lateral dimensions (e.g., lateral dimensions in the X-direction and the Y-direction). The width in the X-direction of each of the additional gate structures 126 may be substantially the same as or may be different than the width of each of the linear gate structures 112. By way of non-limiting example, each of the additional gate structures 126 may be formed to have a width within a range of from about 5 nm to about 15 nm, such as from about 5 nm to about 10 nm, or from about 10 nm to about 15 nm. In some embodiments, each of the additional gate structures 126 is formed to have width a within a range of from about 5 nm to about 10 nm.

The additional gate structures 126 may be formed using conventional processes and conventional processing equipment, which are not described in detail herein. By way of non-limiting example, a gate material may be conformally formed (e.g., deposited through one or more of a PVD process, a CVD process, an ALD process, and a spin-coating process) over exposed surfaces of the gate oxide material 124, and then an anisotropic etching process may be performed to remove the gate material from surfaces of the gate oxide material 124 outside of the trenches 110 and from portions of laterally-central portions of upper surfaces of the gate oxide material 124 within trenches 110, while maintaining the gate material on the side surface of the gate oxide material 124 within the trenches 110 to form the additional gate structures 126.

Next, referring to FIG. 10A, a sacrificial material 127 may be formed (e.g., non-conformally formed) on or over exposed surfaces of the additional gate structures 126 and the gate oxide material 124. The sacrificial material 127 may substantially fill remaining portions of the trenches 110 (FIG. 9A). For example, the sacrificial material 127 may substantially fill remaining portions of the trenches 110 (FIG. 9A) intervening between (e.g., in the X-direction) laterally neighboring additional gate structures 126. FIG. 10B is a simplified partial plan view of the semiconductor device structure 100 at the process stage depicted in FIG. 10A, wherein the sacrificial material 127 is depicted as transparent to show the other components of the semiconductor device structure 100 provided thereunder.

As a non-limiting example, the sacrificial material 127 may be formed of and include one or more of carbon and a conventional resist material, such as a conventional photoresist material (e.g., a conventional positive tone photoresist, a conventional negative tone photoresist) or a conventional thermoresist material. If the sacrificial material 127 comprises a photoresist material, exposing (e.g., if the photoresist material comprises a positive tone photoresist) or not exposing (e.g., if the photoresist material comprises a negative tone photoresist) the sacrificial material 127 to at least a minimum threshold dosage of electromagnetic radiation may cause the sacrificial material 127 to become at least partially soluble in a developer. If the sacrificial material 127 comprises a thermoresist material, exposing or not exposing the sacrificial material 127 to at least a minimum threshold temperature may cause the sacrificial material 127 to become at least partially soluble in a developer. As shown in FIG. 10A, the sacrificial material 127 may exhibit a substantially planar upper surface. In additional embodiments, the sacrificial material 127 exhibits a non-planar upper surface defined by elevated regions and recessed regions.

The sacrificial material 127 may be formed using conventional processes (e.g., conventional deposition processes) and conventional processing equipment, which are not described in detail herein. By way of non-limiting example, the sacrificial material 127 may be formed on or over exposed surfaces of the additional gate structures 126 and the gate oxide material 124 through one or more of in situ growth, spin-on coating, blanket coating, CVD, PECVD, ALD, and PVD.

Referring next to FIG. 11A, upper portions of the sacrificial material 127 (FIG. 10A), the additional gate structures 126, the gate oxide material 124 (FIG. 10A), the channel pillars 122, the linear oxide structures 114, the linear gate structures 112, and the linear dielectric structures 108 may be removed through at least one planarization process, such as a conventional chemical-mechanical planarization (CMP) process. As shown in FIG. 11A, the planarization process may form linear resist structures 128 and additional oxide structures 125 from the sacrificial material 127 (FIG. 10A) and the gate oxide material 124 (FIG. 10A), respectively. In addition, the planarization process may form uppermost surfaces (e.g., in the Z-direction) of the linear resist structures 128, the additional gate structures 126, the additional oxide structures 125, the channel pillars 122, the linear oxide structures 114, the linear gate structures 112, and the linear dielectric structures 108 to be substantially coplanar with one another about a plane 130 (shown in FIG. 11A using dashed lines). FIG. 11B is a simplified partial plan view of the semiconductor device structure 100 at the process stage depicted in FIG. 11A.

Referring next to FIG. 12A, upper portions of the linear gate structures 112 and the additional gate structures 126 may be selectively removed to recess upper surfaces of the linear gate structures 112 and the additional gate structures 126 relative to upper surfaces of the linear dielectric structures 108, the linear oxide structures 114, the channel pillars 122, the additional oxide structures 125, and the linear resist structures 128. As shown in FIG. 12A, the vertical positions (e.g., in the Z-direction) of the upper surfaces of the linear gate structures 112 and the additional gate structures 126 may be modified to be vertically below the plane 130 that remains shared by the upper surfaces of the linear dielectric structures 108, the linear oxide structures 114, the channel pillars 122, the additional oxide structures 125, and the linear resist structures 128. FIG. 12B is a simplified partial plan view of the semiconductor device structure 100 at the process stage depicted in FIG. 12A.

The upper portions of the linear gate structures 112 and the additional gate structures 126 may be selectively removed using one or more conventional material removal processes (e.g., a conventional wet etching process, a conventional dry etching process), which are not described in detail herein.

Referring next to FIG. 13A, the linear resist structures 128 (FIGS. 12A and 12B) may be selectively removed (e.g., developed), and a dielectric material 132 may be formed on or over exposed surfaces of the linear gate structures 112 and the additional gate structures 126. As shown in FIG. 13A, the dielectric material 132 may substantially fill openings resulting from the removal of the linear resist structures 128 (FIGS. 12A and 12B), and may also substantially fill open volumes (e.g., void spaces) overlying the linear gate structures 112 and the additional gate structures 126 as a result of the formation of the recessed upper surfaces thereof. FIG. 13B is a simplified partial plan view of the semiconductor device structure 100 at the process stage depicted in FIG. 13A.

The dielectric material 132 may comprise one or more of a dielectric oxide material (e.g., silicon dioxide; phosphosilicate glass; borosilicate glass; borophosphosilicate glass; fluorosilicate glass; aluminum oxide; high-k oxides, such as $HfO_x$; a combination thereof), a dielectric nitride material (e.g., SiN, a dielectric oxynitride material (e.g., SiON), a dielectric carbonitride material (e.g., SiCN), and a dielectric carboxynitride material (e.g., SiOCN), and amphorous carbon. A material composition of the dielectric material 132 may be substantially the same as or may be different than that one or more of the linear dielectric structures 108 and the isolation structures 116. In some embodiments, the dielectric material 132 comprises SiN.

As shown in FIG. 13A, in some embodiments, such as in embodiments wherein drain contract structures to be subsequently formed over the channel pillars 122 are to be formed using a subtractive process (e.g., as opposed to a damascene process), upper surfaces of the dielectric material 132 are formed to be substantially coplanar with upper surfaces of the linear dielectric structures 108, the linear oxide structures 114, the channel pillars 122, and the additional oxide structures 125. For example, the upper surfaces of the dielectric material 132 may be formed to be substantially coplanar with the upper surfaces of the linear dielectric structures 108, the linear oxide structures 114, the channel pillars 122, and the additional oxide structures 125 about the plane 130 or about a different plane (e.g., another plane vertically below the plane 130). In additional embodiments, such as in embodiments wherein drain contract structures to be subsequently formed are to be formed using a damascene process (e.g., as opposed to a subtractive process), the upper surfaces of the dielectric material 132 are formed to be substantially non-coplanar with upper surfaces of the linear dielectric structures 108, the linear oxide structures 114, the channel pillars 122, and the additional oxide structures 125. For example, in such embodiments, one or more upper surfaces the dielectric material 132 may vertically overlie the upper surfaces of the linear dielectric structures 108, the linear oxide structures 114, the channel pillars 122, and the additional oxide structures 125.

The linear resist structures 128 may be removed and the dielectric material 132 may be formed using conventional processes (e.g., conventional development processes, conventional deposition processes, conventional material removal processes) and conventional processing equipment, which are not described in detail herein. For example, the linear resist structures 128 may be selectively removed by developing the linear resist structures 128 with a developer (e.g., a positive tone developer, a negative tone developer) suitable for the material composition and exposure (e.g., photoexposure, thermoexposure) of the linear resist structures 128. In addition, the dielectric material 132 may be formed on or over exposed surfaces of the linear gate structures 112 and the additional gate structures 126 using one or more conventional deposition processes (e.g., one or more of an ALD process, a CVD process, a PECVD process, a PVD process, and a spin-coating process). If desired (e.g., if drain contract structures to be subsequently formed over the channel pillars 122 are to be formed using a subtractive process), upper portions of the dielectric material 132 may then be removed using one or more conventional material removal processes, such as one or more conventional CMP processes.

Referring next to FIG. 14A, drain contacts 134 may be formed on or over upper surfaces of the channel pillars 122. In addition, the drain contacts 134 may be laterally separated from one another by an isolation material 136. FIG. 14B is a simplified partial plan view of the semiconductor device structure 100 at the process stage depicted in FIG. 14A.

The drain contacts 134 may be formed of and include at least one electrically conductive material, such as one or more of W, WN, Ni, Ta, TaN, TaSi, Pt, Cu, Ag, Au, Al, Mo, Ti, TiN, TiSi, TiSiN, TiAlN, MoN, Ir, $IrO_x$, Ru, $RuO_x$, and conductively doped silicon. The material composition of the drain contacts 134 may be the same as or may be different than the material composition of the source line contacts 104. In at least some embodiments, the drain contacts 134 are formed of and include Ti. In addition, the drain contacts 134 may be formed on or over the channel pillars 122 to any desired thickness (e.g., to the same thickness as the source line contacts 104, or to a different thickness than the source line contacts 104), and may substantially cover the upper surfaces of the channel pillars 122. As shown in FIG. 14A, in some embodiments, portions of the drain contacts 134 extend beyond lateral boundaries of the channel pillars 122. For example, portions of the drain contacts 134 may cover portions of upper surfaces of the linear oxide structures 114 and the additional oxide structures 125 laterally neighboring the channel pillars 122. In additional embodiments, the drain contacts 134 may be substantially confined within the lateral boundaries of the channel pillars 122.

The isolation material 136 may comprise at least one dielectric material, such as one or more of a dielectric oxide material (e.g., silicon dioxide; phosphosilicate glass; borosilicate glass; borophosphosilicate glass; fluorosilicate glass; aluminum oxide; high-k oxides, such as $HfO_x$; a combination thereof), a dielectric nitride material (e.g., SiN, a dielectric oxynitride material (e.g., SiON), a dielectric carbonitride material (e.g., SiCN), and a dielectric carboxynitride material (e.g., SiOCN), and amphorous carbon. A material composition of the isolation material 136 may be substantially the same as or may be different than that one or more of the dielectric material 132, the linear dielectric structures 108, and the isolation structures 116. In some embodiments, such as embodiments wherein the drain contacts 134 are formed through a subtractive process (described in further detail below), the isolation material 136 is formed after the formation of the dielectric material 132, and may have a material composition substantially the same as or different than that of the dielectric material 132. In additional embodiments, such as embodiments wherein the drain contacts 134 are formed through a damascene process (also described in further detail below), the isolation material 136 comprises an upper region of the dielectric material 132 (and, hence, may be formed as part of and have substantial the same material composition as the dielectric material 132).

In some embodiments, the drain contacts 134 are formed on or over the channel pillars 122 through a subtractive process. An electrically conductive material may be formed (e.g., through one or more conventional deposition processes, such as one or more of an ALD process, a CVD process, a PECVD process, a PVD process, and a spin-coating process) on or over upper surfaces of the channel pillars 122, the linear oxide structures 114, the additional oxide structures 125, the linear gate structures 112, the additional gate structures 126, and the linear dielectric structures 108. Portions of the electrically conductive material not overlying the channel pillars 122 may then be selectively removed (e.g., through conventional photolithographic patterning and etching processes) to form the drain contacts 134. Thereafter, the isolation material 136 may be formed (e.g., through one or more conventional deposition processes, such as one or more of an ALD process, a CVD process, a PECVD process, a PVD process, and a spin-coating process) between the drain contacts 134. If desired, at least the isolation material 136 may be then subjected to at least one planarization process (e.g., at least one CMP process) to remove portions of the isolation material 136 positioned vertically above upper surfaces of the drain contacts 134.

In additional embodiments, the drain contacts 134 are formed on or over the channel pillars 122 through a damascene process. For example, portions of a dielectric material (e.g., portions of the dielectric material 132 if the dielectric material 132 vertically extends beyond upper surfaces of the channel pillars 122; portions of another dielectric material formed on or over upper surfaces of the dielectric material 132 and the channel pillars 122) overlying the channel pillars 122 may then be selectively removed to form the isolation material 136. The isolation material 136 exhibits trenches (e.g., openings, apertures, vias) extending therethrough, the trenches each individually at least partially (e.g., substantially) laterally aligned (e.g., in the X-direction and in the Y-direction) with one of the channel pillars 122. Thereafter, the trenches may be filled (e.g., through one or more conventional deposition processes, such as one or more of an ALD process, a CVD process, a PECVD process, a PVD process, and a spin-coating process) with an electrically conductive material, and at least one planarization process (e.g., at least one CMP process) may be used to remove portions of the electrically conductive material positioned vertically above upper surfaces the isolation material 136 and form the drain contacts 134.

The semiconductive device structure 100 at the processing stage processing stage depicted in FIG. 14A (e.g., following the formation of the drain contacts 134) includes multiple vertical access devices 135 (e.g., vertical transistors, vertical thin film transistors (TFTs)). Each vertical access device 135 individually includes one of the channel pillars 122, one of the drain contacts 134 vertically above the channel pillar 122, one the source line contacts 104 (which is shared between at least some of the vertical access devices 135) vertically below the channel pillar 122, one of the linear oxide structures 114 laterally neighboring a side of the channel pillar 122, one of the linear gate structures 112 laterally neighboring the linear oxide structure 114, a portion of one of the additional oxide structure 125 laterally neighboring another side of the channel pillar 122, and one of the additional gate structures 126 a laterally neighboring the portion of the additional oxide structure 125. Each vertical access device 135 may be considered to be "double-gated" since one of the linear gate structures 112 and one of the additional gate structures 126 laterally neighbor opposing sides of the channel pillar 122 of the vertical access device 135.

One of ordinary skill in the art will appreciate that, in accordance with additional embodiments of the disclosure, the features and feature configurations described above in relation to FIGS. 1A through 14B may be readily adapted to the design needs of different semiconductor devices (e.g., different memory devices). As a non-limiting example, the vertical access devices 135 may be formed to exhibit a "single-gate" configuration wherein each vertical access device 135 individually includes one of the linear gate structures 112 laterally neighboring a side the channel pillar 122, but does not include one of the additional gate structures 126 laterally neighboring an opposing side of the channel pillar 122. An isolation structure comprising an electrically insulating material may laterally-neighbor the opposing side of the channel pillar 122 instead of the additional linear gate structure 126. Referring to FIG. 7A, such a "single-gate" configuration of the vertical access devices 135 (FIG. 14A) may, for example, be facilitated by forming isolation structures in remainders of the trenches 110 following the process stage depicted in FIG. 14A; planarizing (e.g., using at least one CMP process) upper surfaces of the isolation structures, the channel pillars 122, the linear oxide structures 114, the linear gate structures 112, and the linear dielectric structures 108; and then forming the drain contacts 134 over the channel pillars 122 through a process substantially similar to that previously described with reference to FIGS. 14A and 14B.

Thus, in accordance with embodiments of the disclosure, a method of forming a device comprises forming dielectric structures over other dielectric structures overlying conductive contact structures, the dielectric structures separated from one another by trenches and laterally extending orthogonal to the other dielectric structures and the conductive contact structures. Conductive gate structures are formed on exposed side surfaces of the dielectric structures within the trenches. Dielectric oxide structures are formed on exposed side surfaces of the conductive gate structures within the trenches. Exposed portions of the other dielectric structures are removed to form isolation structures. Semiconductive pillars are formed on exposed side surfaces of the dielectric oxide structures and the isolation structures within the trenches. The semiconductive pillars are in electrical contact with the conductive contact structures. Additional conductive contact structures are formed on upper surfaces of the semiconductive pillars.

Furthermore, a device according to embodiments of the disclosure comprises oxide semiconductor pillars on conductive contact structures overlying conductive line structures; nitride dielectric structures on the conductive contact structures and contacting lower portions of sidewalls of the oxide semiconductor pillars; oxide dielectric structures on the nitride dielectric structures and contacting upper portions of the sidewalls of the oxide semiconductor pillars; additional oxide dielectric structures on the conductive contact structures and contacting additional sidewalls of the oxide semiconductor pillars opposite the sidewalls; conductive gate structures on the nitride dielectric structures and contacting sidewalls of the oxide dielectric structures, the conductive gate structures laterally extending perpendicular to the conductive line structures; and additional conductive contact structures on upper surfaces of the oxide semiconductor pillars.

With returned reference to FIG. 14A, in additional embodiments the semiconductor device structure 100 may be formed to include air gaps (e.g., void spaces, open volumes) between the linear gate structures 112 of laterally neighboring vertical access devices 135 and/or between the additional gate structures 126 of laterally neighboring vertical access devices 135. The air gaps may serve as insulators having a dielectric constant ($\epsilon$) of about 1. The air gaps may limit capacitance and increase shorts margin between the linear gate structures 112 and/or the additional gate structures 126 of laterally neighboring vertical access devices 135, and may reduce cross-talk between laterally neighboring vertical access devices 135.

By way of non-limiting example, FIGS. 15A through 17B are simplified partial cross-sectional (FIGS. 15A, 16A, and 17A) and simplified partial plan (i.e., FIGS. 15B, 16B, and 17B) views illustrating embodiments of a method of forming a semiconductor device structure 100' including air gaps. The semiconductor device structure 100' may be formed in substantially the same manner as and may exhibit substantially the same features (e.g., structures, materials) as the semiconductor device structure 100 up through the processing stage previously described herein with reference to FIGS. 12A and 12B. Accordingly, the method of forming the semiconductor device structure 100' described hereinbelow with respect to FIGS. 15A through 18B incorporates the processing stages and features previously described in relation to the formation of the semiconductor device structure 100 up through the processing stage previously described with reference to FIGS. 12A and 12B. However, the dimensions and/or spacing of one or more features of the semiconductor device structure 100 may be modified in relations to those previously described with references to FIGS. 1A through 12B to accommodate desired feature sizes and/or spacing in the semiconductor device structure 100'. For example, the linear dielectric structures 108 (FIGS. 12A and 12B) of the semiconductor device structure 100' may be formed (e.g., at the processing stage previously described with reference to FIGS. 1A and 1B) to exhibit reduced widths (e.g., in the X-direction) and spacing relative to the linear dielectric structures 108 (FIGS. 12A and 12B) of the semiconductor device structure 100, which may effectuate changes (e.g., reductions) to at least the spacing of other features of the semiconductor device structure 100' relative to the those of the semiconductor device structure 100. In some embodiments, the linear dielectric structures 108 (FIGS. 12A and 12B) of the semiconductor device structure 100' are about half as wide as the linear dielectric structures 108 (FIGS. 12A and 21B) of the semiconductor device structure 100. The reductions to the widths of the linear dielectric structures 108 (FIGS. 12A and 12B) of the semiconductor device structure 100' may, for example, facilitate the formation of air gaps from the linear dielectric structures 108 (FIGS. 12A and 12B) having substantially the same lateral dimensions (e.g., widths in the X-direction) as other air gaps formed from the linear resist structures 128 (FIGS. 12A and 12B), as described in further detail below.

Referring to FIG. 15A, after recessing the upper surfaces of the linear gate structures 112 and the additional gate structures 126 through the processing acts previously described with reference to FIGS. 12A and 12B, the linear dielectric structures 108 (FIGS. 12A and 12B) may be selectively removed to form openings 137, and the linear resist structures 128 (FIGS. 12A and 12B) may be selectively removed to form additional openings 139. The openings 137 may laterally extend between and separate the laterally neighboring linear gate structures 112, and the additional openings 139 may laterally extend between and separate the laterally neighboring additional gate structures 126. As shown in FIG. 15A, if the linear dielectric structures 108 (FIGS. 12A and 12B) and the linear resist structures 128 (FIGS. 12A and 12B) are formed to exhibit substantially the same widths (e.g., in the X-directions), the openings 137 and the additional openings 139 may also exhibit substantially the same widths as one another. In additional embodiments, the openings 137 are formed to exhibit different widths than the additional openings 139. FIG. 15B is a simplified partial plan view of the semiconductor device structure 100' at the process stage depicted in FIG. 15A.

The openings 137 and the additional openings 139 may be formed using conventional material removal processes and conventional processing equipment, which are not described in detail herein. For example, the linear dielectric structures 108 (FIGS. 12A and 12B) may be selectively removed using at least one material removal process (e.g., at least one etching process, such as at least one anisotropic etching process) to form the openings 137, and the linear resist structures 128 (FIGS. 12A and 12B) may be selectively removed using at least one other material removal process (e.g., at least one development process, such as the development process previously described herein with reference to FIGS. 13A and 13B) to form the additional openings 139. The linear dielectric structures 108 (FIGS. 12A and 12B) may be selectively removed before the selective removal of the linear resist structures 128 (FIGS. 12A and 12B), or the linear dielectric structures 108 (FIGS. 12A and 12B) may be selectively removed after the selective removal of the linear resist structures 128 (FIGS. 12A and 12B).

Figure 16A:
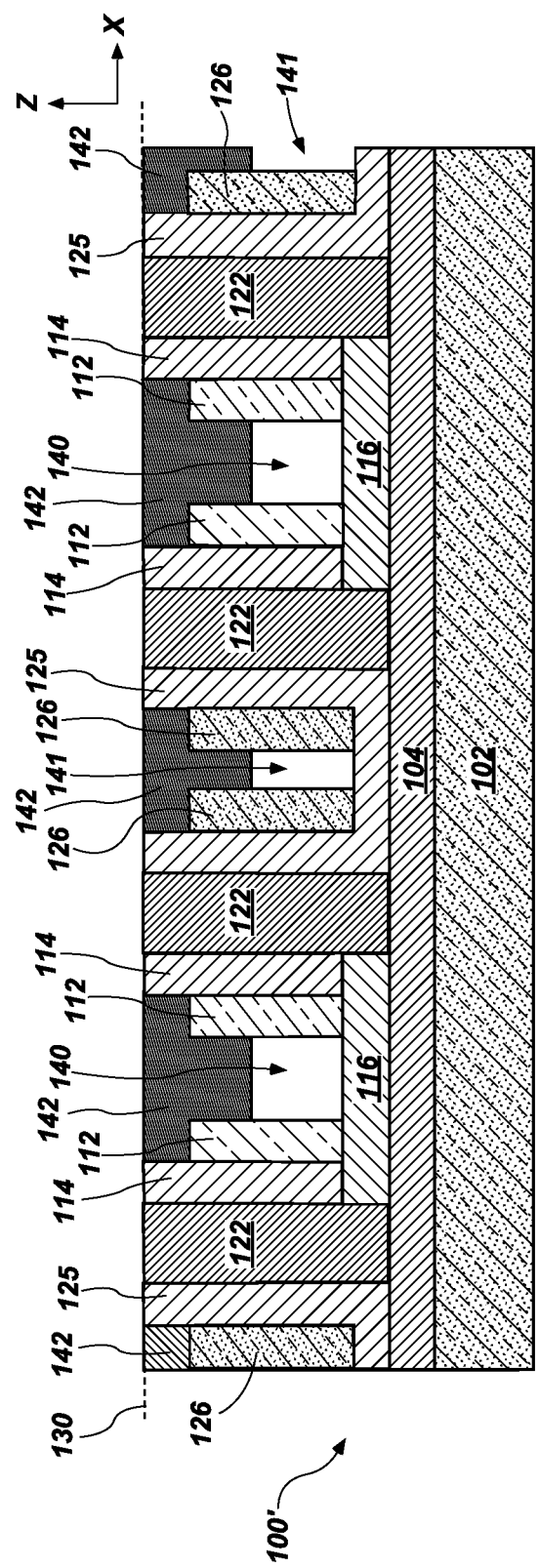
Figure 16B:
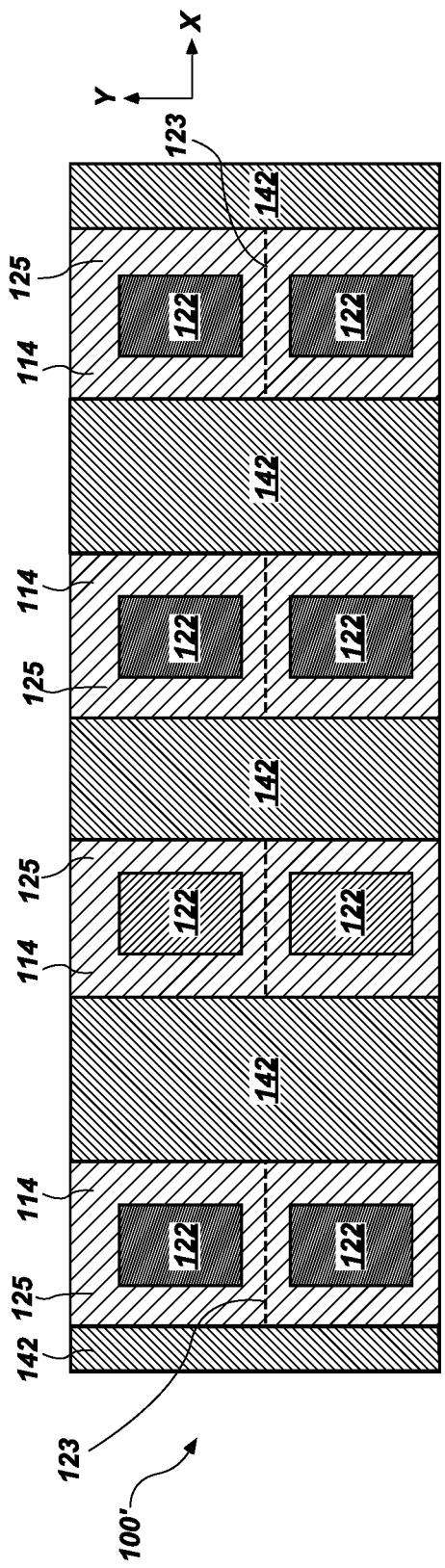

Referring next to FIG. 16A, a dielectric material 142 may be formed on or over portions of exposed surfaces of the linear gate structures 112 and the additional gate structures 126. As shown in FIG. 16A, the dielectric material 142 may partially (e.g., less than completely) fill the openings 137 (FIGS. 15A and 15B) and the additional openings 139 (FIGS. 15A and 15B) to form air gaps 140 and additional air gaps 141, respectively. The air gaps 140 may each individually be formed to have a height (e.g., in the Z-direction) greater than or equal to about one-half (e.g., greater than or equal to two-thirds, greater than or equal to three-fourths) the height of the linear gate structures 112 laterally adjacent thereto. In addition, the additional air gaps 141 may each individually be formed to have a height (e.g., in the Z-direction) greater than or equal to about one-half (e.g., greater than or equal to two-thirds, greater than or equal to three-fourths) the height of the additional gate structures 126 laterally adjacent thereto. The dielectric material 142 may also substantially fill open volumes overlying the linear gate structures 112 and the additional gate structures 126. FIG. 16B is a simplified partial plan view of the semiconductor device structure 100' at the process stage depicted in FIG. 16A.

The dielectric material 142 comprise one or more of a dielectric oxide material (e.g., silicon dioxide; phosphosilicate glass; borosilicate glass; borophosphosilicate glass; fluorosilicate glass; aluminum oxide; high-k oxides, such as $HfO_x$; a combination thereof), a dielectric nitride material (e.g., SiN, a dielectric oxynitride material (e.g., SiON), a dielectric carbonitride material (e.g., SiCN), and a dielectric carboxynitride material (e.g., SiOCN), and amphorous carbon. A material composition of the dielectric material 142 may be substantially the same as or may be different than that one or more of the linear dielectric structures 108 and the isolation structures 116. In some embodiments, the dielectric material 142 comprises SiN.

As shown in FIG. 16A, in some embodiments, such as in embodiments wherein drain contract structures to be subsequently formed over the channel pillars 122 are to be formed using a subtractive process, upper surfaces of the dielectric material 142 are formed to be substantially coplanar with upper surfaces of the linear oxide structures 114, the channel pillars 122, and the additional oxide structures 125. For example, the upper surfaces of the dielectric material 142 may be formed to be substantially coplanar with the upper surfaces of the linear oxide structures 114, the channel pillars 122, and the additional oxide structures 125 about the plane 130 or about a different plane (e.g., another plane vertically below the plane 130). In additional embodiments, such as in embodiments wherein drain contract structures to be subsequently formed are to be formed using a damascene process, the upper surfaces of the dielectric material 142 are formed to be substantially non-coplanar with upper surfaces of the linear oxide structures 114, the channel pillars 122, and the additional oxide structures 125. For example, in such embodiments, one or more upper surfaces the dielectric material 142 may vertically overlie the upper surfaces of the linear oxide structures 114, the channel pillars 122, and the additional oxide structures 125.

The dielectric material 142 may be formed using conventional processes (e.g., conventional deposition processes, conventional material removal processes) and conventional processing equipment, which are not described in detail herein. For example, the dielectric material 142 may be formed on or over portions of the exposed surfaces of the linear gate structures 112 and the additional gate structures 126 using one or more conventional non-conformal deposition processes (e.g., a non-conformal PVD process). If desired (e.g., if drain contract structures to be subsequently formed over the channel pillars 122 are to be formed using a subtractive process), upper portions of the dielectric material 142 may then be removed using one or more conventional material removal processes, such as one or more conventional CMP processes.

Referring next to FIG. 17A, drain contacts 144 may be formed on or over upper surfaces of the channel pillars 122. In addition, the drain contacts 144 may be laterally separated from one another by an isolation material 146. The drain contacts 144 and the isolation material 146 may respectively be substantially similar to and may respectively be formed in substantially the same manner as the drain contacts 134 and the isolation material 136 previously described herein with reference to FIGS. 14A and 14B. FIG. 17B is a simplified partial plan view of the semiconductor device structure 100' at the process stage depicted in FIG. 17A.

The semiconductive device structure 100' at the processing stage processing stage depicted in FIG. 17A (e.g., following the formation of the drain contacts 144) includes multiple vertical access devices 145 (e.g., vertical transistors, vertical TFTs). The vertical access devices 145 exhibit "double-gate" configurations, and each individually include one of the channel pillars 122, one of the drain contacts 144 vertically above the channel pillar 122, one the source line contacts 104 (which is shared between at least some of the vertical access devices 145) vertically below the channel pillar 122, one of the linear oxide structures 114 laterally neighboring a side of the channel pillar 122, one of the linear gate structures 112 laterally neighboring the linear oxide structure 114, a portion of one of the additional oxide structure 125 laterally neighboring another side of the channel pillar 122, and one of the additional gate structures 126 a laterally neighboring the portion of the additional oxide structure 125. The air gaps 140 of the semiconductive device structure 100' may limit capacitance and increase shorts margin between the linear gate structures 112 of laterally neighboring vertical access devices 145 of the semiconductive device structure 100', and the additional air gaps 141 of the semiconductive device structure 100' may limit capacitance and increase shorts margin between the additional linear gate structures 112 of laterally neighboring vertical access devices 145 of the semiconductive device structure 100'. The air gaps 140 and the additional air gaps 141 of the semiconductive device structure 100' may also reduce crosstalk between laterally neighboring vertical access devices 145.

Figure 18:
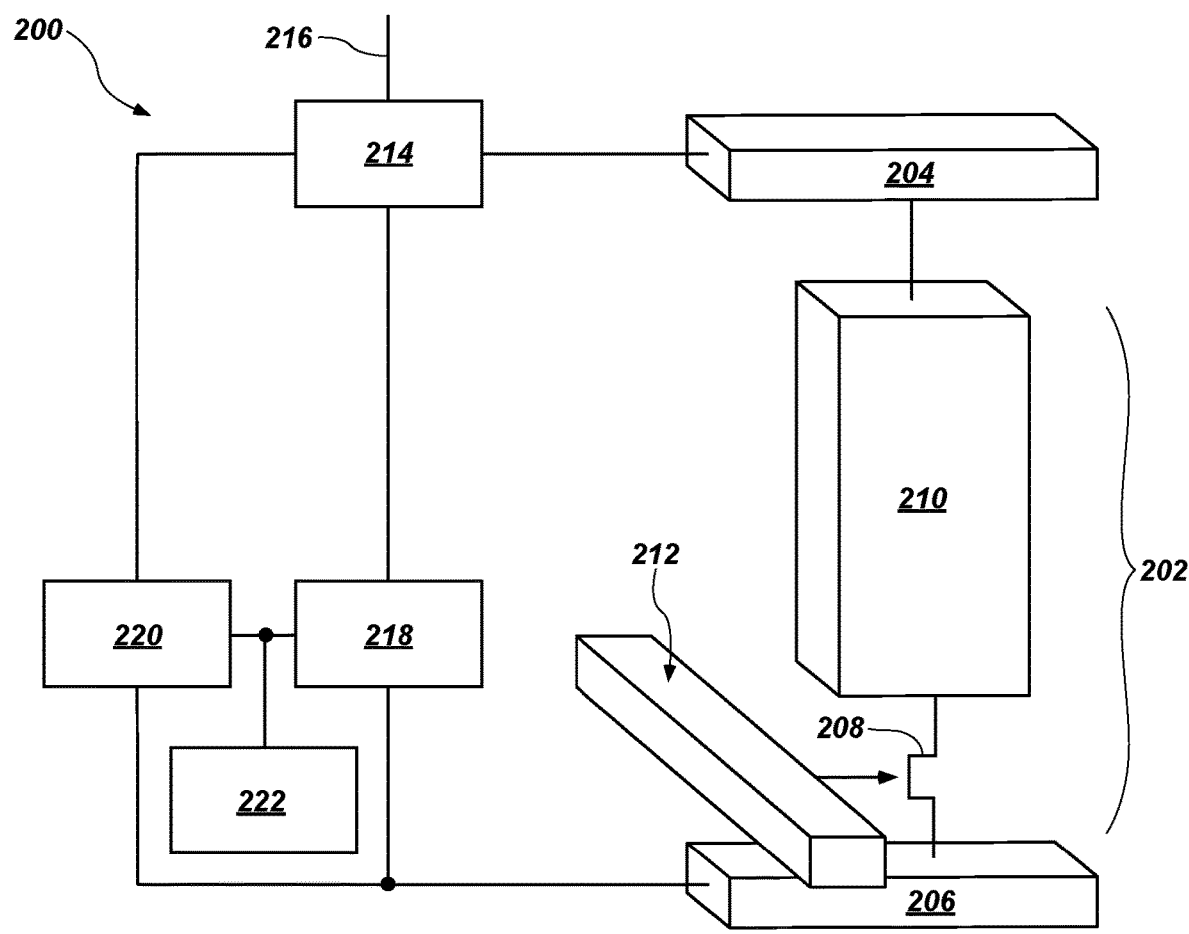
FIG. 18 is a functional block diagram of a memory device, in accordance with an embodiment of the disclosure.

FIG. 18 illustrates a functional block diagram of a memory device 200 in accordance with an embodiment of the disclosure. The memory device 200 may include, for example, an embodiment of a semiconductor device structure previously described herein (e.g., the semiconductor device structures 100, 100'). The memory device 200 may include at least one memory cell 202 between at least one data line 204 (e.g., bit line, data line) and at least one source line 206. The memory cell 202 may include an access device 208 (e.g., a vertical access device, such as one of the vertical access devices 135, 145 previously described herein) coupled or connected in series with a memory element 210. The access device 208 may act as a switch for enabling and disabling current flow through the memory element 210. By way of non-limiting example, the access device 208 may be an access device with at least one gate connected to an access line 212 (e.g., a word line). The access line 212 may extend in a direction substantially perpendicular to that of the data line 204. The data line 204 and the source line 206 may be connected to logic for programming and reading the memory element 210. A control multiplexer 214 may have an output connected to the data line 204. The control multiplexer 214 may be controlled by a control logic line 216 to select between a first input connected to a pulse generator 218, and a second input connection to read-sensing logic 220 (e.g., a sense amplifier).

During a programming operation, a voltage greater than a threshold voltage of the access device 208 may be applied to the access line 212 to turn on the access device 208. Turning on the access device 208 completes a circuit between the source line 206 and the data line 204 by way of the memory element 210. After turning on the access device 208, a bias generator 222 may establish, by way of the pulse generator 218, a bias voltage potential difference between the data line 204 and the source line 206. During read operation, the bias generator 222 may establish, by way of read-sensing logic 220, a read bias voltage potential difference between the data line 204 and the source line 206. The read bias voltage may be lower than the reset bias voltage. The read bias voltage may enable current to flow through the memory element 210 according to a resistance state of an active material thereof. For example, for a given read bias voltage, if the active material is in a high-resistance state (e.g., a reset state), a relatively smaller current may flow through the memory element 210 than if the active material is in a low-resistance state (e.g., a set state). The amount of current flowing through memory element 210 during the read operation may be compared to a reference input by the read-sensing logic 220 to discriminate whether the data stored in the memory cell 202 is a logic "1" or a logic "0."

Thus, a memory device according to embodiments of the disclosure comprises an access line, a data line, a source line, memory cells between the data line and the source line, and air gaps. Each memory cell comprises a vertical access device and a memory element. The vertical access device is electrically coupled to the access line and comprises channel pillar, a source contact, a drain contact, a gate electrode, and a gate dielectric material. The channel pillar comprises at least one oxide semiconductor material. The source contact is vertically between the source line and the channel pillar. The drain contact is on the channel pillar. The gate electrode laterally neighbors the channel pillar and is electrically coupled to the access line. The gate dielectric material is between the channel pillar and the gate electrode. The memory element is between the data line and the drain contact of the vertical access device. The air gaps are located between laterally neighboring gate electrodes of laterally neighboring vertical access devices of laterally neighboring memory cells.

Figure 19:
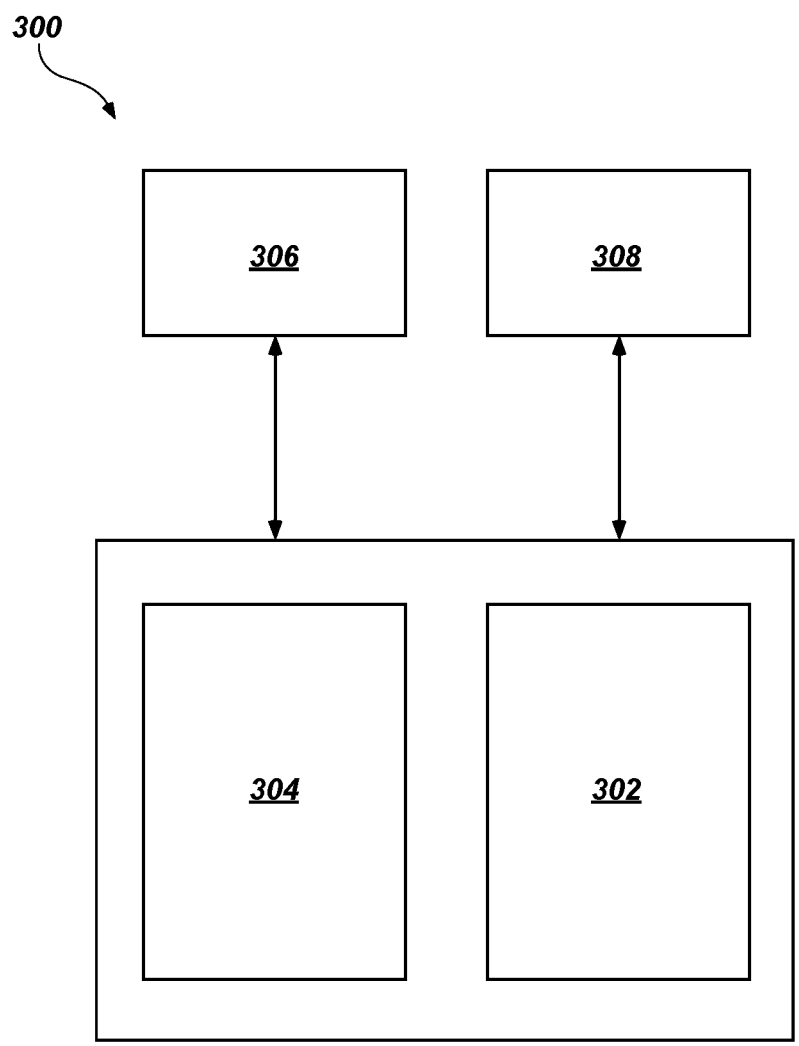
FIG. 19 is a schematic block diagram of an electronic system, in accordance with an embodiment of the disclosure.

Semiconductor device structures (e.g., the semiconductor device structures 100, 100') and semiconductor devices (e.g., the memory device 200) in accordance with embodiments of the disclosure may be used in embodiments of electronic systems of the disclosure. For example, FIG. 19 is a block diagram of an illustrative electronic system 300 according to embodiments of disclosure. The electronic system 300 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPad® or SURFACE® tablet, an electronic book, a navigation device, etc. The electronic system 300 includes at least one memory device 302. The memory device 302 may comprise, for example, an embodiment of one or more of a semiconductor device structure (e.g., semiconductor device structures 100, 100') and a semiconductor device (e.g., the memory device 200) previously described herein. The electronic system 300 may further include at least one electronic signal processor device 304 (often referred to as a "microprocessor"). The electronic signal processor device 304 may, optionally, include an embodiment of a semiconductor device structure (e.g., semiconductor device structures 100, 100') and a semiconductor device (e.g., the memory device 200 previously described herein. The electronic system 300 may further include one or more input devices 306 for inputting information into the electronic system 300 by a user, such as, for example, a mouse or other pointing device, a keyboard, a touchpad, a button, or a control panel. The electronic system 300 may further include one or more output devices 308 for outputting information (e.g., visual or audio output) to a user such as, for example, a monitor, a display, a printer, an audio output jack, a speaker, etc. In some embodiments, the input device 306 and the output device 308 may comprise a single touchscreen device that can be used both to input information to the electronic system 300 and to output visual information to a user. The input device 306 and the output device 308 may communicate electrically with one or more of the memory device 302 and the electronic signal processor device 304.

Thus, an electronic system according to embodiments of the disclosure comprises an input device, an output device, a processor device operably coupled to the input device and the output device, and a memory device operably coupled to the processor device. The memory device comprises at least one access device comprising a laterally heterogeneous oxide semiconductor channel vertically between a metallic source contact and a metallic drain contact, and at least one gate electrode neighboring at least one side surface of the laterally heterogeneous oxide semiconductor channel.

The methods of the disclosure may facilitate the formation of devices (e.g., access devices, semiconductor devices, memory devices) and systems (e.g., electronic systems) having one or more of increased performance, increased efficiency, increased reliability, and increased durability as compared to conventional devices (e.g., conventional access devices, conventional semiconductor devices, conventional memory devices) and conventional systems (e.g., conventional electronic systems). For example, the methods of the disclosure may facilitate improved current flow properties in channel pillars (e.g., the channel pillars 122) formed through the methods of the disclosure as compared to conventional channel pillars formed through conventional processes (e.g., conventional channel pillars formed by vertically etching a bulk volume of semiconductive material using one or more using one or more conventional etch chemistries, such as conventional hydrogen-containing plasma chemistries), facilitating improved performance and reliability in devices (e.g., access devices, semiconductor devices, memory devices) and systems (e.g., electronic systems) including the channel pillars of the disclosure.

While the disclosure is susceptible to various modifications and alternative forms, specific embodiments have been shown by way of example in the drawings and have been described in detail herein. However, the disclosure is not limited to the particular forms disclosed. Rather, the disclosure is to cover all modifications, equivalents, and alternatives falling within the scope of the following appended claims and their legal equivalents.

What is claimed is:

1. A method of forming a semiconductor device, comprising:
    forming linear dielectric structures over isolation lines overlying conductive contact structures, the linear dielectric structures separated from one another by trenches and laterally extending orthogonal to the isolation lines and the conductive contact structures;
    forming conductive gate structures on exposed side surfaces of the linear dielectric structures within the trenches;
    forming linear oxide structures on exposed side surfaces of the conductive gate structures within the trenches;
    removing exposed portions of the isolation lines to form isolation structures;
    forming semiconductive pillars on exposed side surfaces of the linear oxide structures and the isolation structures within the trenches, the semiconductive pillars in electrical contact with the conductive contact structures; and
    forming additional conductive contact structures on upper surfaces of the semiconductive pillars.

2. The method of claim 1, further comprising, prior to forming the additional conductive contact structures:
    forming a dielectric oxide material on exposed surfaces of the semiconductive pillars;
    forming additional conductive gate structures at least on exposed side surfaces of the dielectric oxide material within the trenches;
    forming a sacrificial material on exposed surfaces of the additional conductive gate structures and the dielectric oxide material;
    planarizing the linear dielectric structures, the conductive gate structures, the linear oxide structures, the semiconductive pillars, the dielectric oxide material, the additional conductive gate structures, and the sacrificial material;
    recessing upper surfaces of the conductive gate structures and the additional conductive gate structures; and
    forming a dielectric material at least on the recessed upper surfaces of the conductive gate structures and the additional conductive gate structures.

3. The method of claim 2, wherein forming a dielectric oxide material on exposed surfaces of the semiconductive pillars comprises:
    partially filling remaining portions of the trenches with the dielectric oxide material; and
    completely filling additional trenches extending orthogonal to the trenches with the dielectric oxide material.

4. The method of claim 2, wherein:
    forming a dielectric oxide material on exposed surfaces of the semiconductive pillars comprises:
        partially filling remaining portions of the trenches with the dielectric oxide material; and
        partially filling additional trenches extending orthogonal to the trenches with the dielectric oxide material; and
    forming additional conductive gate structures at least on exposed side surfaces of the dielectric oxide material within the trenches comprises forming the additional conductive gate structures on the exposed side surfaces of the dielectric oxide material within the trenches and on additional exposed side surfaces of the dielectric oxide material within the additional trenches such that portions of the additional conductive gate structures laterally extend toward the conductive gate structures.

5. The method of claim 2, wherein planarizing the dielectric structures, the conductive gate structures, the linear oxide structures, the semiconductive pillars, the dielectric oxide material, the additional conductive gate structures, and the sacrificial material comprises removing portions of the dielectric oxide material and the sacrificial material to form additional dielectric oxide structures and resist structures, respectively.

6. The method of claim 2, further comprising, after recessing the upper surfaces of the conductive gate structures:
    removing the linear dielectric structures to form openings between at least some of the conductive gate structures laterally neighboring one another; and
    removing remaining portions of the sacrificial material to form additional openings between at least some of the additional conductive gate structures longitudinally neighboring one another.

7. The method of claim 6, wherein forming the dielectric material at least on the recessed upper surfaces of the conductive gate structures and the additional gate structures comprises:
    partially filling the openings with the dielectric material to form air gaps between the at least some of the conductive gate structures; and
    partially filling the additional openings with the dielectric material to form additional air gaps between the at least some of the additional conductive gate structures.

8. The method of claim 2, further comprising removing remaining portions of the sacrificial material after recessing the upper surfaces of the conductive gate structures to form openings between at least some of the additional conductive gate structures laterally neighboring one another.

9. The method of claim 8, wherein forming the dielectric material at least on the recessed upper surfaces of the conductive gate structures and the additional gate structures comprises substantially completely filling the openings with the dielectric material.

10. The method of claim 1, wherein forming semiconductive pillars on exposed side surfaces of the linear oxide structures and the isolation structures within the trenches comprises:
    conformally depositing a semiconductive material on exposed surfaces of the linear dielectric structures, the conductive gate structures, the linear oxide structures, the isolation structures, and the conductive contact structures;

removing portions of the semiconductive material from upper surfaces of at least the conductive gate structures and the linear dielectric structures and from portions of upper surfaces of the conductive contact structures within the trenches to form linear semiconductive structures laterally extending parallel to the dielectric structures;

masking portions of the linear semiconductive structures overlying the conductive contact structures; and selectively removing unmasked portions of the linear semiconductive structures to form the semiconductive pillars.

11. The method of claim 1, wherein forming semiconductive pillars on exposed side surfaces of the linear oxide structures and the isolation structures within the trenches comprises forming the semiconductive pillars to comprise at least one semiconductor material having a band gap larger than polysilicon.

12. The method of claim 1, wherein forming semiconductive pillars on exposed side surfaces of the linear oxide structures and the isolation structures within the trenches comprises forming the semiconductive pillars to comprise an oxide semiconductor material.

13. The method of claim 1, wherein forming semiconductive pillars on exposed side surfaces of the linear oxide structures and the isolation structures within the trenches comprises forming the semiconductive pillars to comprise one or more of $Zn_xSn_yO$, $In_xZn_yO$, $Zn_xO$, $In_xGa_yZn_zO$, $In_xGa_ySi_zO_a$, $In_xW_yO$, $In_xO$, $Sn_xO$, $Ti_xO$, $Zn_xON_z$, $Mg_xZn_yO$, $In_xZn_yO$, $In_xGa_yZn_zO$, $Zr_xIn_yZn_zO$, $Hf_xIn_yZn_zO$, $Sn_xIn_yZn_zO$, $Al_xSn_yIn_zZn_aO$, $Si_xIn_yZn_zO$, $Zn_xSn_yO$, $Al_xZn_ySn_zO$, $Ga_xZn_ySn_zO$, $Zr_xZn_ySn_zO$, and $In_xGa_ySi_zO$.

14. The method of claim 1, wherein forming additional conductive contact structures on upper surfaces of the semiconductive pillars comprises forming the additional conductive contact structures through a subtractive process.

15. The method of claim 1, wherein forming additional conductive contact structures on upper surfaces of the semiconductive pillars comprises forming the additional conductive contact structures through a damascene process.

* * * * *

UNITED STATES PATENT AND TRADEMARK OFFICE
CERTIFICATE OF CORRECTION

PATENT NO. : 11,437,521 B2
APPLICATION NO. : 16/596487
DATED : September 6, 2022
INVENTOR(S) : Scott E. Sills, Ramanathan Gandhi and Durai Vishak Nirmal Ramaswamy It is certified that error appears in the above-identified patent and that said Letters Patent is hereby corrected as shown below:

In the Specification

| | | |
|---|---|---|
| Column 1, | Line 48, | change "(e.g." to --(e.g.,-- |
| Column 4, | Line 36, | change "vertically closest)" to --(e.g., vertically closest)-- |
| Column 6, | Line 16, | change "amphorous" to --amorphous-- |
| Column 6, | Line 32, | change "SiN," to --SiN),-- |
| Column 6, | Line 35, | change "amphorous" to --amorphous-- |
| Column 6, | Line 61, | change "spacing the" to --spacing of the-- |
| Column 7, | Line 42, | change "width a" to --a width-- |
| Column 8, | Line 25, | change "width a" to --a width-- |
| Column 8, | Line 64, | change "sidewalls the" to --sidewalls of the-- |
| Column 9, | Line 11, | change "that polycrystalline" to --that of polycrystalline-- |
| Column 10, | Lines 63-64, | change "semiconductive" to --semiconductor-- |
| Column 11, | Line 30, | change "semiconductive" to --semiconductor-- |
| Column 13, | Line 14, | change "dimensions additional" to --dimensions of additional-- |
| Column 14, | Line 28, | change "width a" to --a width-- |
| Column 16, | Line 18, | change "SiN," to --SiN),-- |
| Column 16, | Line 20, | change "amphorous" to --amorphous-- |
| Column 16, | Line 23, | change "that one" to --that of one-- |
| Column 16, | Line 49, | change "surfaces the" to --surfaces of the-- |
| Column 17, | Line 42, | change "SiN," to --SiN),-- |
| Column 17, | Line 45, | change "amphorous" to --amorphous-- |
| Column 17, | Line 47, | change "that one" to --that of one-- |
| Column 18, | Line 41, | change "surfaces the" to --surfaces of the-- |
| Column 18, | Line 43, | change "semiconductive" to --semiconductor-- |
| Column 18, | Lines 43-44, | change "processing stage processing stage depicted" to --processing stage depicted-- |
| Column 18, | Line 50, | change "one the" to --one of the-- |
| Column 18, | Line 58, | change "a laterally" to --laterally-- |
| Column 19, | Line 7, | change "side the" to --side of the-- |

Signed and Sealed this
Thirteenth Day of December, 2022

*Katherine Kelly Vidal*

Katherine Kelly Vidal
*Director of the United States Patent and Trademark Office*

CERTIFICATE OF CORRECTION (continued)
U.S. Pat. No. 11,437,521 B2

| | | |
|---|---|---|
| Column 20, | Lines 24-25, | change "relation relations to" to --relation to-- |
| Column 20, | Line 41, | change "21B" to --12B-- |
| Column 21, | Line 52, | change "SiN," to --SiN),-- |
| Column 21, | Line 54, | change "amphorous" to --amorphous-- |
| Column 21, | Line 57, | change "that one" to --that of one-- |
| Column 22, | Line 12, | change "surfaces the" to --surfaces of the-- |
| Column 22, | Line 22, | change "one the" to --one of the-- |
| Column 22, | Line 42, | change "semiconductive" to --semiconductor-- |
| Column 22, | Line 58, | change "a laterally" to --laterally-- |
| Column 22, | Line 59, | change "semiconductive" to --semiconductor-- |
| Column 22, | Lines 62-63, | change "semiconductive" to --semiconductor-- |
| Column 22, | Line 64, | change "semiconductive" to --semiconductor-- |
| Column 22, | Line 66, | change "112" to --126-- |
| Column 22, | Line 67, | change "semiconductive" to --semiconductor-- |
| Column 24, | Line 19, | change "iPad®" to --IPAD®-- |
| Column 24, | Line 32, | change "200 previously" to --200) previously-- |
| Column 25, | Lines 6-7, | change "using one or more using one or more conventional" to --using one or more conventional-- |